United States Patent
Fukuda

(10) Patent No.: US 7,196,468 B2
(45) Date of Patent: Mar. 27, 2007

(54) ORGANIC ELECTROLUMINESCENT DISPLAY HAVING TWO REFLECTING PORTIONS FOR REDUCING INTENSITY REFLECTANCE OF THE EXTERNAL LIGHT BY AN OPTICAL INTERFERENCE EFFECT

(75) Inventor: Yoshinori Fukuda, Saitama (JP)

(73) Assignee: Pioneer Corporation, Tokyo (JP)

( * ) Notice: Subject to any disclaimer, the term of this patent is extended or adjusted under 35 U.S.C. 154(b) by 266 days.

(21) Appl. No.: 10/674,537

(22) Filed: Oct. 1, 2003

(65) Prior Publication Data

US 2004/0066123 A1   Apr. 8, 2004

(30) Foreign Application Priority Data

Oct. 2, 2002   (JP)   ............................. P2002-290519

(51) Int. Cl.
*H01J 1/62* (2006.01)
(52) U.S. Cl. ...................................... 313/506; 313/504
(58) Field of Classification Search ................ 313/504, 313/506, 110, 112, 113
See application file for complete search history.

(56) References Cited

U.S. PATENT DOCUMENTS

| | | | |
|---|---|---|---|
| 5,049,780 A | 9/1991 | Dobrowolski et al. | 313/509 |
| 6,410,168 B1 | 6/2002 | Tamura | 428/690 |
| 6,411,019 B1 | 6/2002 | Hofstra | 313/112 |
| 6,429,451 B1 | 8/2002 | Hung et al. | 257/40 |
| 6,639,250 B1 * | 10/2003 | Shimoda et al. | 257/98 |
| 6,707,521 B2 * | 3/2004 | Satake et al. | 349/138 |
| 2001/0010367 A1 * | 8/2001 | Burnell-Jones | 252/301.36 |
| 2001/0033135 A1 * | 10/2001 | Duggal et al. | 313/506 |
| 2002/0175619 A1 * | 11/2002 | Kita et al. | 313/504 |
| 2002/0190639 A1 * | 12/2002 | Yamada et al. | 313/504 |
| 2003/0067266 A1 * | 4/2003 | Kim et al. | 313/504 |
| 2004/0056590 A1 * | 3/2004 | Lim et al. | 313/506 |
| 2005/0099113 A1 * | 5/2005 | Yamada | 313/504 |

FOREIGN PATENT DOCUMENTS

EP          0 372 763 A2       6/1990

(Continued)

OTHER PUBLICATIONS

Krasnov, Alexey N., "High-Contrast Organic Light-Emitting Diodes on Flexible Substrates"; Applied Physics Letters, American Institute of Physics, New York, vol. 80, No. 20; May 20, 2002, pp. 3853-3855.

(Continued)

*Primary Examiner*—Joseph Williams
*Assistant Examiner*—Bumsuk Won
(74) *Attorney, Agent, or Firm*—Drinker Biddle & Reath LLP

(57) ABSTRACT

An organic EL display equipped with an organic EL device with an organic material sandwiched by at least two electrodes, including: a light emitting layer which emits light; a front reflecting portion arranged on the side of a viewer with respect to the light emitting layer; and a rear reflecting portion arranged on the side opposite to the viewer with respect to the light emitting layer, wherein the optical film thickness of the organic material, intensity reflectance $R_1$ at the front reflecting portion and intensity reflectance $R_2$ at the front reflecting portion are adjusted so that the external light intensity reflectance of the display viewed from the viewer is 10% or less by an optical interference effect.

13 Claims, 10 Drawing Sheets

FOREIGN PATENT DOCUMENTS

| | | |
|---|---|---|
| EP | 1 160 890 A2 | 12/2001 |
| JP | 2529741 B | 6/1996 |
| JP | 2003-017274 A | 1/2003 |

OTHER PUBLICATIONS

Renault, O., et al.: "A Low Reflectivity Multilayer Cathode for Organic Light-Emitting Diodes", Thin Solid Films, Elsevier-Sequoia S.A. Lausanne, Switzerland, vol. 379, No. 1-2, Dec. 8, 2000, pp. 195-198.

Fukuda, Y., et al.: An Organic LED Display Exhibiting Pure RGB Colors:, Synthetic Metals, Elsevier Sequia, Lausanne, Switzerland, vol. 111/112, Jun. 1, 2000, pp. 1-6.

Takada, N., et al.: "Controlled Spontaneous Emission in Organic Electroluminescent Devices", Optoelectronics Devices and Technologies, Mita Press, Tokyo, Japan, vol. 8, No. 3, Sep. 1993, pp. 403-412.

* cited by examiner

ORGANIC ELECTROLUMINESCENT DISPLAY HAVING TWO REFLECTING PORTIONS FOR REDUCING INTENSITY REFLECTANCE OF THE EXTERNAL LIGHT BY AN OPTICAL INTERFERENCE EFFECT

The present disclosure relates to the subject matter contained in Japanese Patent Application No. 2002-290519 filed on Oct. 2, 2002, which is incorporated herein by reference in its entirety.

BACKGROUND OF THE INVENTION

1. Field of the Invention

The present invention relates to an organic electroluminescence device.

2. Description of the Related Art

Generally, an organic electroluminescence device (hereinafter, referred to simply as "organic EL device") has a structure with an organic material laminate sandwiched between a transparent conductive film and a metallic electrode. The light (hereinafter, referred to as "EL light") emitted within the device is extracted externally from the device through a transparent electrode.

The metallic electrode (backside electrode) arranged on a side where the EL light is to be extracted, which is the side opposite to a viewer, is made of a metal alloy such as an alloy of Mg and Ag or an alloy of Al and Li. The metal alloys having reflectance strongly reflects the external light which is incident from the outside. Therefore, the display thus obtained is largely influenced by the external light reflected at the backside electrode, and provides poor visibility like a mirror face when seen from a viewer.

In order to avoid such inconvenience, for the purpose of blocking the reflection of the external light, an expensive circularly-polarizing filter is generally attached to the exterior of the device. However, in a so-called "top emission structure" in which a light extracting electrode is arranged on an organic film but not on the side of a substrate, it is difficult to provide the circularly-polarizing filter to be in contact with the exterior of the device.

Even where the light extracting electrode is arranged on the side of the substrate, in a case where the substrate itself is made thin, the thickness of the circularly-polarizing filter hinders low-profiling and weight reduction. Further, the transmittance of the circularly-polarizing filter is about 40% so that the efficiency of the organic EL light is half or less the case with no filter.

Another known technique for preventing reduction in the visibility is to make the rear surface of the device non-reflective. A known method of making a non-reflective electrode is to use an absorbent material as an electrode. Japanese Patent No.2529741 discloses a method for manufacturing a device with low reflectance having a backside electrode in a laminated structure as shown in FIG. 4 using optical interference.

Still another known technique for preventing the reduction in the visibility is to make both electrodes transparent or semi-transparent and arrange a non-reflective film outside either electrode to suppress the reflection of external light at the backside electrode, thereby improving visibility.

The devices, in which the rear surface of the device is made low-reflective or non-reflective to improve visibility without providing a circularly-polarizing filter, provide an abrupt reduction in the efficiency of externally extracting light from the device.

The internally emitted light in the organic EL device is emitted with equal intensities in all the directions as shown in FIG. 1. Therefore, the light with the intensity equal to that emitted forward is also emitted in the rear direction. The light actually extracted outward from the device is the sum of electric field amplitudes of the light emitted forward and the light emitted in the rear direction and reflected by the backside electrode. Generally, in the organic EL device, the thickness of an optical film in a laminated device structure is optimized so that the phase difference between the forward emitted light and the reflected light of the rearward emitted light satisfies the condition of mutual intensifying of optical interference, thereby effectively extracting the light multiply reflected from the backside electrode and other reflecting planes as EL light emitted outward.

When the non-reflective electrode is used as the backside electrode, the EL light emitted to the rear side is not extracted on the front side. As a result, the intensity of the organic EL light thus externally extracted is supposedly about ½ of that of the entire EL light.

However, the actual experiment shows that the intensity of the organic EL light externally extracted has been reduced to about ¼ in the device equipped with the non-reflective electrode as compared with the ordinary EL device. This means that the efficiency is referred to about half of that of ordinary device equipped with the circularly-polarizing filter.

SUMMARY OF THE INVENTION

It is therefore an object of the invention to provide a method of improving the intensity of externally extracted electroluminescence light when using the technique of improving the visibility of the display by reducing the reflectance on a rear side, in an organic electroluminescence device using the light extracted to at least the one side, and an organic EL display using such a technique.

In order to achieve the object, according to one aspect of the invention, there is provided an organic electroluminescent display including: an organic electroluminescent device having a light emitting layer made of an organic material and at least two electrodes sandwiching the light emitting layer; a front reflecting portion arranged on a side of a viewer with respect to the light emitting layer; and a rear reflecting portion arranged on a side opposite to the viewer with respect to the light emitting layer, wherein the optical film thickness of the light emitting layer, intensity reflectance $R_1$ at the front reflecting portion and intensity reflectance $R_2$ at the rear reflecting portion are configured so that an intensity reflectance of the external light viewed from the viewer is set to be 10% or less by an optical interference effect.

According to a second aspect of the invention, there is provided an organic electroluminescent display equipped with an organic electroluminescent device having a laminated optical structure with low reflectance and transmittance, wherein the organic electroluminescent device includes: a substrate; a first semi-transparent film; a second semi-transparent film; and a reflective film, and wherein the first semi-transparent film, the second semi-transparent film and the reflective film are laminated on the substrate in this order or an order opposite thereto.

According to a third aspect of the invention, there is provided an organic electroluminescent display including: a laminated optical structure with low reflectance and transmittance; and an organic electroluminescent device, wherein the organic electroluminescent device includes: an organic electroluminescent layer having a light emitting layer made of an organic material and a transporting layer configured to transport charges to the light emitting layer, and two electrodes configured to sandwich the organic electroluminescent layer, wherein the laminated optical structure includes at least two layers, and wherein the laminated optical structure includes the transporting layer.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
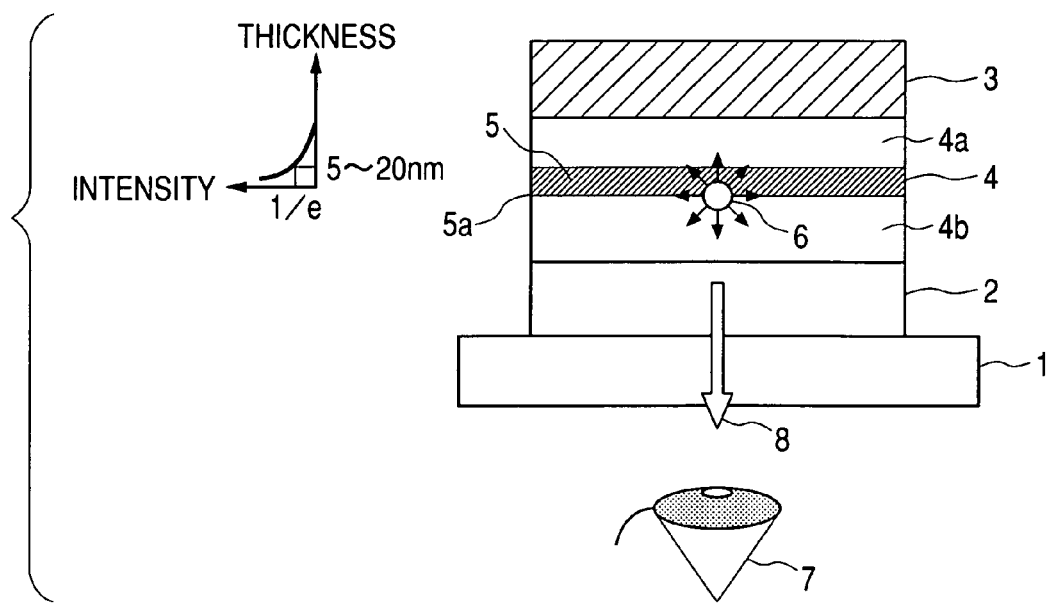
FIG. 1 is a view showing a sectional structure of an organic EL device in an organic EL display and a distribution of the intensity of EL light emitted internally within the organic EL device.

Referring now to the accompanying drawings, there are shown preferred embodiments of the invention.

The inventor of the present invention, on a basis of an experiment, have found that when the reflectance of the backside electrode of an organic electroluminescence device (hereinafter, referred to simply as "organic EL device") is reduced nearly to zero, the efficiency of extracting an EL light externally from the device is reduced to approximately ¼, and the efficiency can be improved when the reflectance of the backside electrode is being effectively left.

The inventor of the present invention investigated, on a basis of interference model, the EL light emitted internally within a device and reflected light of external light which is incident from the outside of the device and reflected to the outside again, and found that both light beams are correlated with the reflectance and transmittance of each of two areas sandwiching an EL light-emitting layer within the device and an optical distance of each of the light beams within the device.

The inventors found that there is a range of the reflectance and transmittance of each of the two areas sandwiching the above light emitting layer which can improve the efficiency of externally extracting the EL light while maintaining the reflectance of the external light at a low value, in view of the fact that a difference exists between the equation representative of the efficiency of extracting the EL light and the equation representative of the reflectance of the external light.

Now referring to the drawings, a detailed explanation will be given of an organic EL display.

FIG. 1 is a view showing a sectional structure of the organic EL device in an organic EL display and a distribution of the intensity of the EL light emitted internally within the organic EL device. The organic EL light device includes a transparent electrode 2 arranged on a glass substrate 1 and configured as an anode, a backside electrode 3 configured as a cathode and an organic layer 4 sandwiched between the transparent electrode 2 and the backside electrode 3.

A viewer 7 sees the EL light 8 emitted externally from the device through the transparent electrode 2.

The organic layer 4 is made by heating and evaporating a plurality of organic materials within a vacuum chamber after the transparent electrode 2 deposited on the glass substrate 1 has been subjected to necessary steps such as patterning. After a hole transporting layer 4a having a thickness of several tens to several hundreds nanometers has been deposited on the transparent electrode 2, a light emitting layer 5 is deposited thereon and an electron transporting layer 4b is further deposited thereon. As the case may be, one of these layers has plural functions. The laminated structure of a plurality of materials may have a single function. The above technique is directed to the method of depositing low-molecular organic EL materials. But, solutions of polymer organic EL materials may be applied successively using the technique of spin-coating or ink jetting. The deposition of the backside electrode 3 is a final step of the deposition and required to minimize the damage to the organic layer 4 previously deposited. For this purpose, in many cases, metal is heated and evaporated in vacuum.

The organic EL device consisting of a plurality of layers stacked successively behaves as a PN-junction type semiconductor light-emitting diode. Specifically, when a voltage is applied between the transparent electrode 2 and the backside electrode 3, holes are injected from the transparent electrode 2 serving as an anode and electrons are injected from the backside electrode 3 serving as a cathode. The holes are transported through the hole transporting layer 4a and the electrons are transported through the electron transporting layer 4b. Both carriers are re-combined within the light emitting layer 5. The energy thus generated excites the molecules within the light emitting layer so that when the excited molecules return to their ground state, fluorescence or phosphorescence is emitted.

Actually, because of the difference in the energy level at the interfaces among the hole transporting layer 4a, light-emitting layer 5 and electron transporting layer 4b, the carriers are concentrated to the interfaces. In most devices, the carrier recombination occurs intensively at either interface of the light emitting layer 5. Therefore, as seen from FIG. 1, it is known that the intensity of the EL light within the device has an abrupt peak in the vicinity of the interface of the light emitting layer 5, and is distributed so as to decrease exponentially toward the inside of the light emitting layer.

It is supposed that the distance until the peak of the intensity decreases to 1/e is 5 nm to 20 nm. Most of EL light emitting points 6 center on the vicinity of the interface to constitute a layer.

Figure 2:
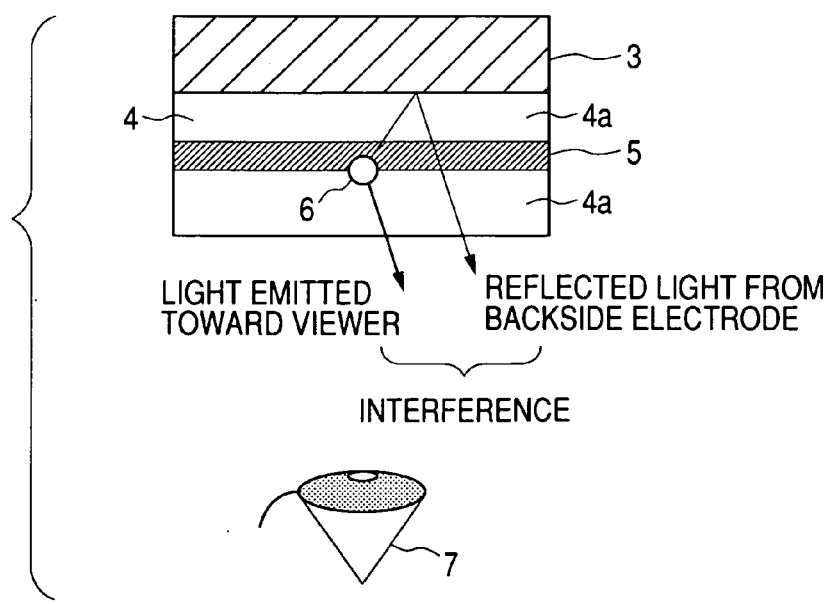
FIG. 2 is a view for explaining an optical interference within the device of the light emitted from an internal EL emitting point.

FIG. 2 is a view for explaining the optical interference within the device of the light emitted from the EL light emitting point 6. The EL light emitted from the EL light emitting point 6 is isometric and non-polarized, and is also emitted toward the backside electrode with the intensity equal to that emitted toward the viewer 7. Each of the EL light emitting points 6 which center on the interface of the light emitting layer 5 emits electromagnetic waves which are not correlated with one another. The electromagnetic waves which are not correlated with one another are difficult to interfere with one another. However, in the organic EL device, strong interference occurs for the following reason.

Generally, a lifetime of a fluorescent light of an organic molecule is several nanoseconds. The fluorescent light propagates several tens of centimeters in vacuum within the lifetime. Generally, the distance between the light emitting point 6 and the backside electrode 3, which is reflective, is several tens to several hundreds of nanometers, and the refractive index of the organic material 4 is in range of from 1.6 to 2. For this reason, the propagating distance of the light reflected from the backside electrode 3 is sufficiently shorter than the coherence length.

Therefore, when the light emitted by the single light emitting point 6 is reflected by the backside electrode 3 to return to the light emitting point 6 again, the light emitting point 6 is continuing to emit the electro-magnetic wave correlated with the reflected light. Each of all the light emitting points brings about the interference phenomenon due to its own reflected light. The synthesized wave thus obtained is observed as the EL light. As a result, the EL light internally emitted is affected by the self-interference phenomenon.

Figure 3:
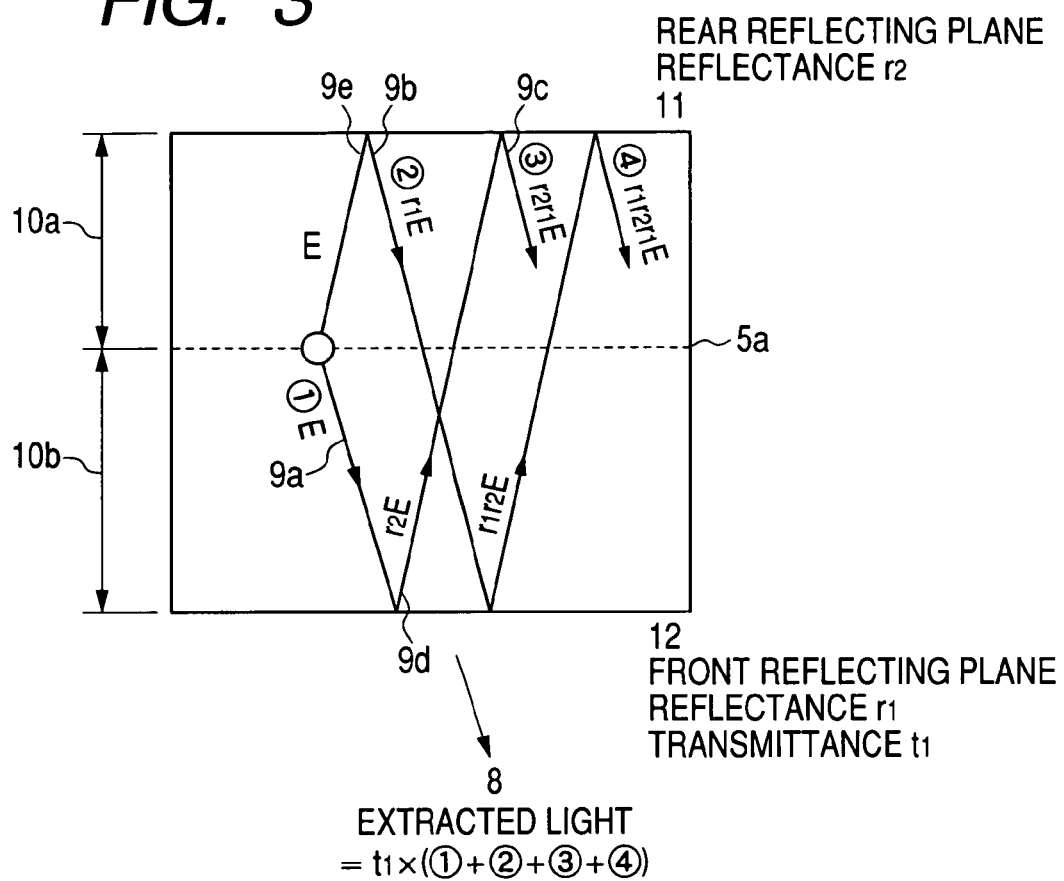
FIG. 3 is a view showing the method for optically optimizing the organic EL device structure.

FIG. 3 is a view showing the method for optically optimizing the organic EL device structure. In order to increase the light 8 extracted externally from the device using the optical interference within the device, the thickness of each of the layers 4a, 5 and 4b constituting the organic material 4 is adjusted so that all the waves shown in FIG. 3 are in phase.

More specifically, the optical distance 10a between the light emitting interface 5a and the rear reflecting plane 11 is adjusted so that first forward emitted light 9a and first rearward reflected light 9b are in phase. Namely, the optical distance 10a may be adjusted so that a phase difference is integer times of 2 p between the round stroke where the first rearward reflected light 9b travels and the single reflection stoke on the rear reflecting plane 11.

Likewise, the optical distance 10b between the light emitting interface 5a and the front reflecting plane 12 is adjusted so that first forward emitted light 9a and first front reflected light 9c are in phase. At this time, the first forward reflected light 9c is first reflected from the front reflecting plane 12, successively reflected by the rear reflecting plane 11 and thereafter interferers with the first front emitted light 9a.

Assuming that the distance 10a between the light emitting interface 5a and the rear reflecting plane 11 is adjusted as described above, as long as the reflected light 9d on the front reflecting plane of the first forward reflected light and the first rearward emitted light 9e are in phase, the first front emitted light 9a and the first front reflected light 9c are automatically in phase. Namely, the optical distance 10b may be adjusted so that a phase difference is integer times of 2 p between the round stroke where the reflected light 9d on the front reflecting plane of the first forward reflected light travels and the single reflection stroke on the front reflecting plane 12.

In the device with the optical distances 10a and 10b thus adjusted, the entire light internally emitted within the device shown in FIG. 3 is intensified in the same phase. It will be understood that on the basis of the light emitting theory of the device, the process of injection, transportation and recombination of the carriers does not vary according to the thickness of the layers constituting the device and the distribution of the intensity of the emitted light within the device and the intensity itself are maintained. In other words, even with such adjustment of the optical film thickness, the intensity of the emitted light when the same current is passes through the device is always the same.

In the organic EL display according of embodiments described later, the optical film thickness of the organic layer 4, the light intensity reflectance R1 at the area from which the light nearer than the light emitting layer 5 to a viewer is reflected and the light intensity reflectance $R_2$ at the area from which the light farther than the light emitting layer 5 from the viewer is reflected are adjusted so that the external light intensity of the organic EL display becomes 10% or less owing to the optical interference effect. The reason will be explained as follows.

The inventors of the present invention attempted an experiment, as shown in FIG. 1, of making the backside electrode 3 non-reflective. In the experiment using the technique described in Japanese Patent No.2529741, there can be provided a non-reflective electrode using the optical interference.

FIRST EXAMPLE

Figure 4:
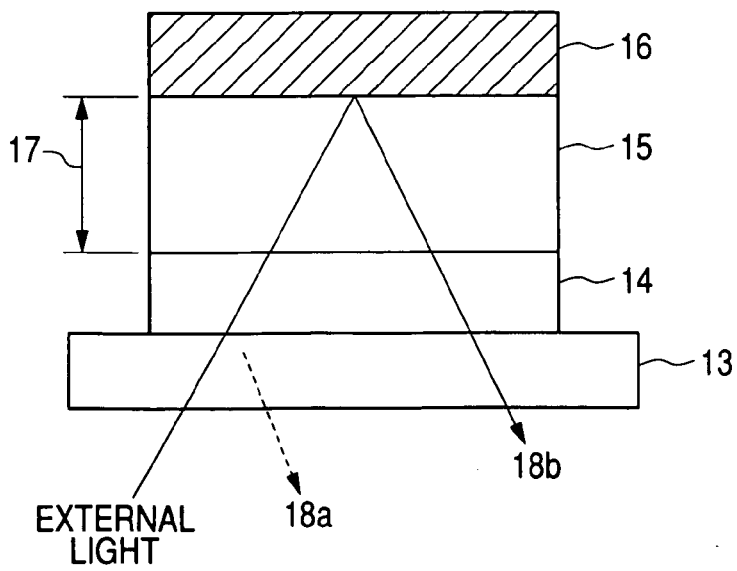
FIG. 4 is a view showing a non-reflective laminated structure of a plurality of stacked optical films.

The technique described in Japanese Patent No.2529741 is as follows. As seen from FIG. 4, on a glass substrate 13, a structure is made in which a second semi-transparent layer 15 is sandwiched between a first semi-transparent layer 14 and a highly reflective layer 16.

In the structure above, the reflectance and transmittance of the first semi-transparent layer 14, the thickness of the second semi-transparent layer 15 and the reflectance of the highly reflective layer 16 are adjusted so that the reflected light 18a from the first semi-transparent layer 14 and the reflected light 18b from the highly-reflective layer 16 cancel each other, thereby making a non-reflective laminated structure. In a simple case, the second semi-transparent layer 15 may have an optical thickness of about ¼λ of an objective wavelength.

For example, the first semi-transparent layer 14 and the highly reflective layer 16 may be made of a metallic aluminum film. The second semi-transparent layer 15 can be made of a semi-transparent organic evaporated film. In addition, the second semi-transparent layer 15 may be made of aluminum quinolinol complex ($Alq_3$) as an organic EL material. The refractive index of $Alq_3$ can be measured by ellipsometry technique, for instance, and is 1.76 at a wavelength of 525 nm.

Assuming that the refractive index is value n, and the thickness is value d, the optical thickness is represented by "n×d". In a case of the $Alq_3$ film, the thickness d which equals to ¼λ (when λ=525 nm) can be calculated as follows.

$$n \cdot d = 525/4 = 131.25$$

Therefore, d=74.6 nm.

Figure 5:
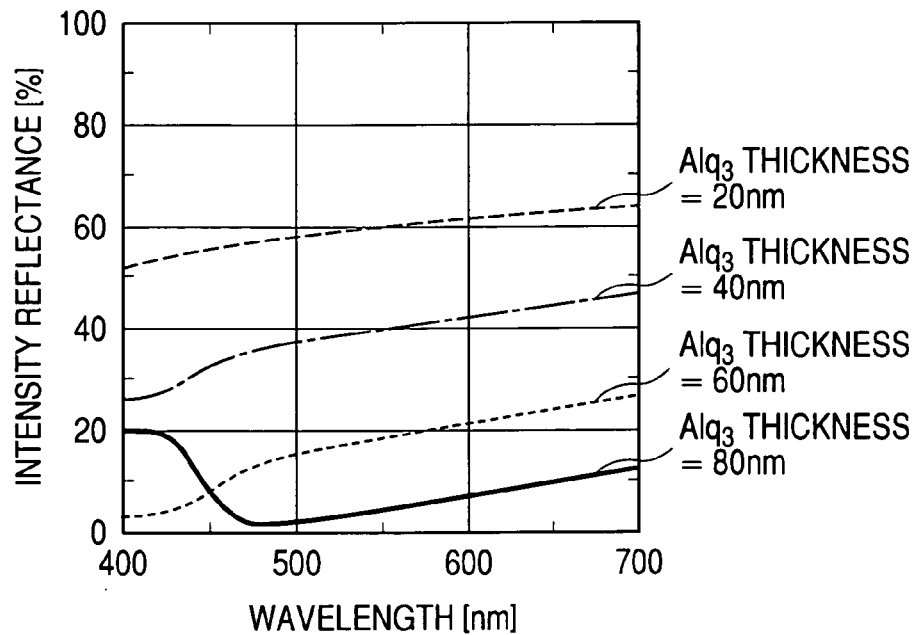
FIG. 5 is a graph showing the wavelength and reflectance of a non-reflective laminated structure consisting of aluminum and organic material.

The reflectance was measured from the side of the glass on the structure in which a very thin aluminum as the first semi-transparent layer 14 is deposited on the glass substrate 13 by heating in vacuum, the $Alq_3$ film having a thickness of 80 nm as the second semi-transparent layer 15 is deposited by heating in vacuum, and an aluminum film having a thickness of 100 nm as the highly reflective layer 16 is vacuum-deposited. The measurement result is shown in FIG. 5. There can be seen from FIG. 5 that the reflectance can be reduced to 1% at the lowest.

Further, as shown in FIG. 5, the lowest reflectance can be adjusted by adjusting the thickness of the $Alq_3$ film as the second semi-transparent layer 15. The reflectance can also be adjusted by varying the thickness of the thin aluminum film as the first semi-transparent layer.

The non-reflective laminated structure thus obtained was used as a cathode of the organic EL device. The transparent electrode deposited on soda lime glass was patterned and the organic EL device was made thereon. A copper phthalocyanine film having a thickness of 25 nm as the hole injecting layer, an α-NPD film having a thickness of 45 nm as the hole transporting film and the $Alq_3$ film having a thickness of 60 nm as the light emitting layer were successively vacuum-deposited. The film thickness of each layer was selected in the combination which gives the maximum EL light intensity externally output by the experiment for the optimum designing as shown in FIG. 3. Thereafter, after an $Li_2O$ film having a thickness of 0.3 nm as an electron injecting additive has been deposited, the organic EL device was manufactured which has the non-reflective laminated structure with the above thin aluminum, $Alq_3$ 80 nm thick and highly reflective aluminum deposited.

SECOND EXAMPLE

In comparison to the above organic EL device, likewise, on the soda lime glass equipped with ITO (Indium Tin Oxide), copper phthalocyanine 25 nm thick, α-NPD 45 nm thick and $Alq_3$ 60 nm thick were successively vacuum-deposited. After $Li_2O$ 0.3 nm thick as an electron injecting additive has been deposited, the organic EL device was manufactured which does not have the non-reflective laminated structure with aluminum 100 nm thick deposited.

Figure 6:
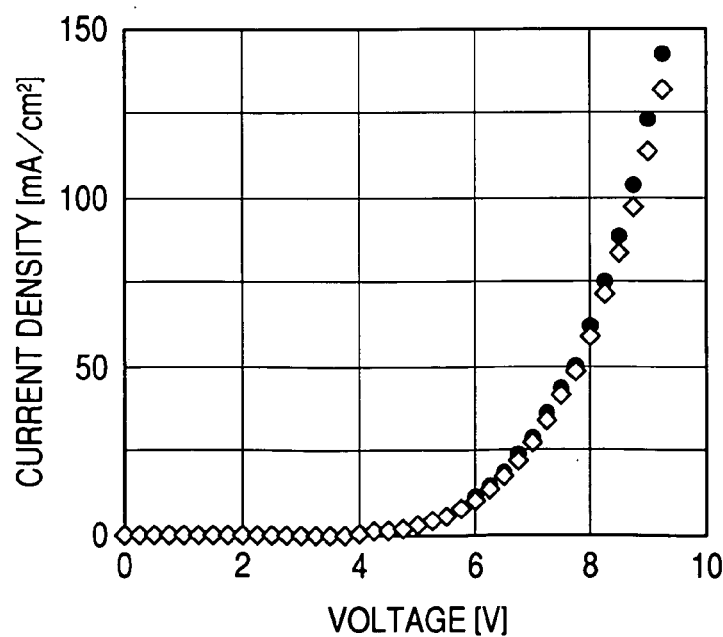
FIG. 6 is a graph showing the voltage-current characteristic of each of the organic EL device having the non-reflective laminated structure (Example 1) and organic EL device with no non-reflective laminated structure (Example 2)

FIG. 6 is a graph showing the voltage-current characteristic of each of the organic EL device having the non-reflective laminated structure of the first example, and organic EL device with no non-reflective laminated structure of the second example. As can be seen from FIG. 6, the voltage-current characteristics in both devices are almost the same. Therefore, it can be supposed that in both devices, the organic diode equally functions and the internal light-emitting intensities for the same current are equal.

Figure 7:
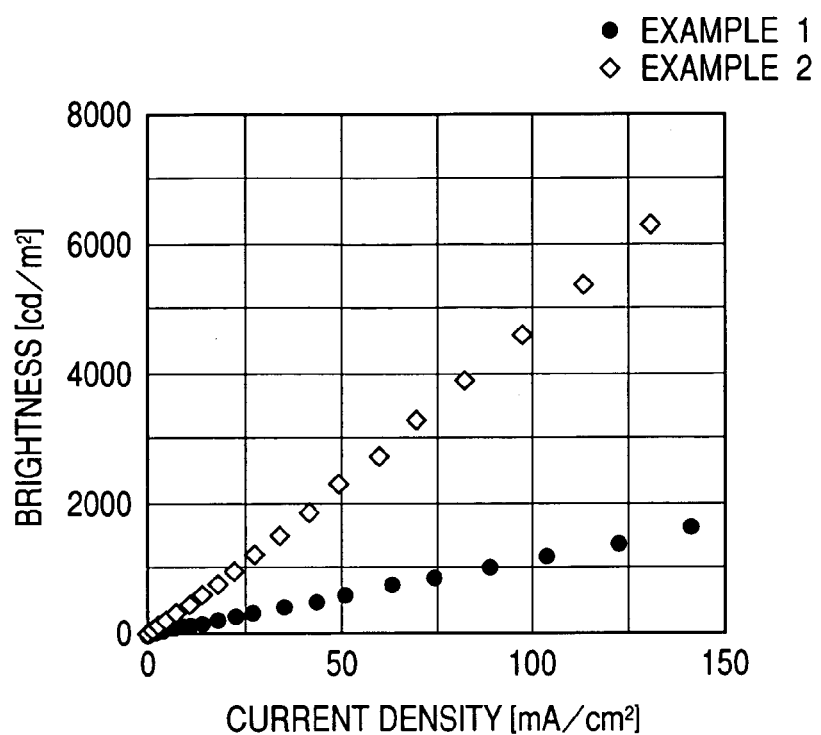
FIG. 7 is a graph showing the current-brightness characteristic in the Examples 1 and 2.

FIG. 7 is a graph showing the current-brightness characteristic in the first and the second examples. As can be seen from FIG. 7, in all the current ranges, the current-brightness efficiency in the first example is always about ¼ of that in the second example.

As understood from the above description, the organic EL device in the second example is designed so that the rearward emitted light intensifies the forward light using the reflection/interference phenomenon. In the organic EL device in the first example, because the rearward reflected light is not reflected forward, the intensity of the extracted light is supposedly about ½. However, a simple model calculation shows that the intensity is not ½, but about ¼.

This can be explained with reference to the following interference model within the organic EL device. First, optical interference phenomenon must be analyzed taking an incident angle of light into consideration. The following explanation will be limited to the case of vertical incidence. If the incidence angle is not vertical, the phase and reflection intensity vary according to the incidence angle, but great importance may be given to the vertical incidence. Further, as regards the polarization of light, because the EL emitted light is non-polarized, and distinction in the polarization in the case of vertical incidence is not required, the polarization of light will be also disregarded hereafter.

In the multiple interference in the optical film, the phase delay or attenuation due to absorption in the multiple reflection and propagation must be taken into consideration. However, as long as the organic EL device is optimized so that all the reflected beams of light are in phase as in Example 1, all the beams of light externally extracted from the device can be regarded to be in the same phase, and therefore, the term of the phase will be omitted in the following explanation.

Further, where these optical interferences are explained quantitatively, after all the superpositions of the electromagnetic waves have been considered, finally, the square of the absolute value must be taken as the intensity of light. Specifically, the characteristics such as intensity, reflectance and transmittance to be measured are represented by the square of amplitude of the electric field of a light wave. Actually, the electromagnetic wave is represented by a complex number, and its square of the absolute value represents the intensity of light. However, for simplicity of explanation, the explanation will be made in the region of real numbers since its generality is not lost.

The formulas of Fresnel on the reflection/refraction phenomenon is described in a document "Principles of Optics I" by Max Born and Emil Wolf, TOKAI UNIVERSITY PUBLISHER, 1974, on pages 61–73.

For example, the reflectance R measured on a certain reflecting plane denotes the reflectance of the intensity of light and is related with a electric-field amplitude reflectance r as follows.

$$R = |r|^2 \qquad \text{Equation (1)}$$

$$\text{Therefore, } r = \sqrt{(|R|)} \qquad \text{Equation (2)}$$

The relationship shown in the equations also holds for complex reflectance. In the following explanation, it is assumed that the intensity of reflectance and intensity of transmittance are denoted by capital letters R and T, and the electric-field amplitude reflectance and electric-field amplitude transmittance are denoted by small letters r and t.

As described in the document "Principles of Optics I", the electric-field amplitude reflectance r and electric-field amplitude transmittance t of the light which is incident from the medium with refractivity $n_1$ to the medium with refractivity with $n_2$ are expressed as follows.

$$r=(n_1-n_2)/(n_2+n_1) \qquad \text{Equation (3)}$$

$$t=2 \cdot n_1/(n_2+n_1) \qquad \text{Equation (4)}$$

As regards the same media, conversely, where the light is incident from the medium with $n_2$ to the medium with $n_1$, the electric-field amplitude reflectance r' and electric-field amplitude transmittance t' are expressed as follows.

$$r'=(n_2-n_1)/(n_2+n_1)=-r \qquad \text{Equation (5)}$$

$$t'=2 \cdot n_2/(n_2+n_1) \qquad \text{Equation (6)}$$

The corresponding intensity reflectance R, R' and intensity transmittance T, T' are expressed as follows.

$$\begin{aligned} R = |r|^2 &= r^2 \\ &= (n_1 - n_2)^2 - /(n_1 + n_2)^2 = R' \end{aligned} \qquad \text{Equation (7)}$$

$$\begin{aligned} T &= (n_2/n_1) \cdot |t|^2 \\ &= 4 \cdot n_1 \cdot n_2/(n_2 + n_1)^2 = T' \\ &= t \cdot t' \end{aligned} \qquad \text{Equation (8)}$$

The following relational expression also holds.

$$r+t'=1$$

$$r^2+t=1$$

On the basis of the above relationships described above, an explanation will be given of the optical model of an organic EL display.

Figure 8:
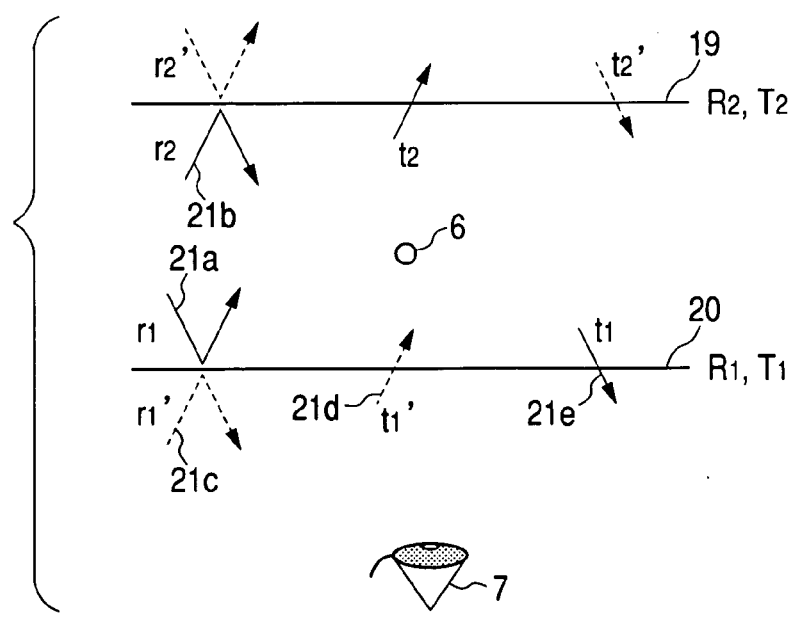
FIG. 8 is a conceptual view of the optical model of an organic EL display.

FIG. 8 is a conceptual view of the optical model of the organic EL display. All the organic EL devices can be simplified optically as illustrated in FIG. 8.

FIG. 3 is a specific case of the case shown in FIG. 8. FIG. 3 shows the case where the reflectance $r_2$ on the rear reflecting plane 11 is high enough so that it can be considered that $r_2$ nearly equals to value "1" and the reflectance $r_1$ on the front reflecting plane 12 is r1<<1. The intensity of the light when reflection is repeated twice or more on the front reflecting plane 12 is negligibly small. Therefore, only the four optical waves 9a, 9b, 9c and 9d within the device have only to be considered.

Figure 9:
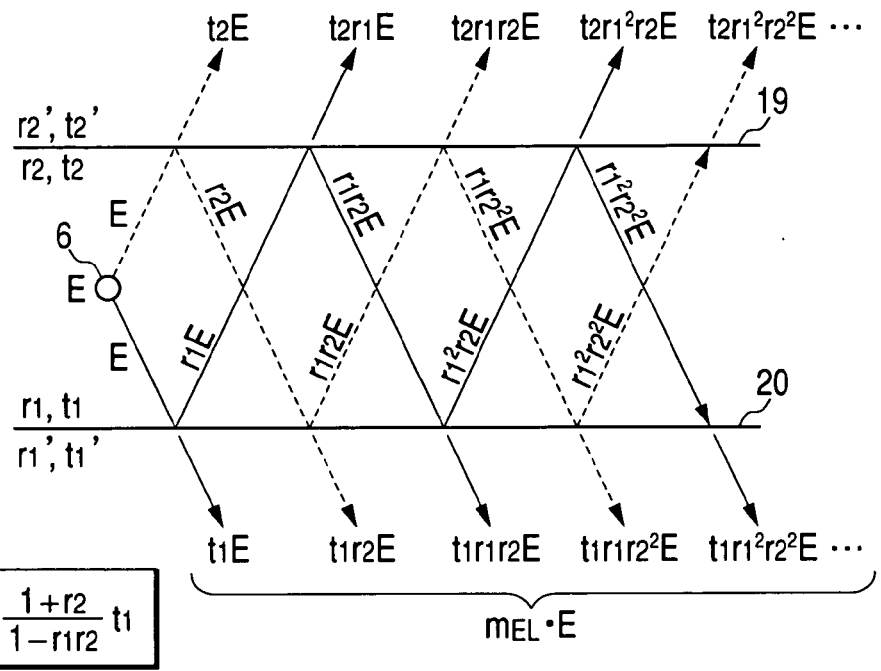
FIG. 9 is a view illustrating the multiple reflection of the light emitted internally in the device and the electric-field amplitude of the light externally extracted from the device in the configuration of FIG. 8.

FIG. 9 is a view illustrating the multiple reflection of the light emitted internally in the device and the electric-field amplitude of the light externally extracted from the device in the configuration of FIG. 8. With the electric-field amplitude of the internally emitted light being E, the electric-field amplitude of each of the light waves is written.

The ratio of the amplitude of the synthesized wave of the light waves externally extracted to the electric-field amplitude E of the internally emitted light is referred to as "synthesized electric-field amplitude transmittance of the extracted EL light" and is simply denoted by $m_{EL}$.

Since all the light beams externally extracted have been adjusted to be in phase, simple addition thereof may be made. Thus, the $m_{EL}$ of the light wave extracted on the side of a viewer 7 can be expressed as follows.

$$\begin{aligned} m_{EL} &= t_1\{1 + r_2 + r_1 r_2 + r_1 r_2^2 + r_1^2 r_2^2 + \ldots \} \\ &= t_1\{(1 + r_1 r_2 + r_1^2 r_2^2 + \ldots) + \\ &\quad r_2(1 + r_1 r_2 + r_1^2 r_2^2 + \ldots)\} \\ &= t_1 \left\{(1 + r_2) \sum_{k=0}^{\infty} (r_1 r_2)^k \right\} = \frac{1+r_2}{1-r_1 r_2} t_1 \end{aligned} \qquad \text{Equation (9)}$$

In the case, an relational expression $0 \leq |r_1 r_2| \leq 1$ led from $0 \leq |r_1| \leq 1$ and $0 \leq |r_2| \leq 1$ and the following formulas have been employed.

$$\lim_{n \to \infty} \sum_{k=0}^{n} p^k = \lim_{n \to \infty} \frac{1-p^{n+1}}{1-p} = \frac{1}{1-p} \qquad \text{Equation (10)}$$

wherein $(0 < p < 1)$

Likewise, the synthesized electric-field transmittance of the EL light ($m_{EL}$) extracted on the side opposite to a viewer 7 can be expressed as follows.

$$\begin{aligned} m_{EL} &= t_2\{1 + r_1 + r_1 r_2 + r_1^2 r_2 + r_1^2 r_2^2 + \ldots\} \\ &= t_2\{(1 + r_1 r_2 + r_1^2 r_2^2 + \ldots) + \\ &\quad r_1(1 + r_1 r_2 + r_1^2 r_2^2 + \ldots)\} \\ &= t_2\left\{(1 + r_1)\sum_{k=0}^{\infty}(r_1 r_2)^k\right\} = \frac{1+r_1}{1-r_1 r_2} t_2 \end{aligned} \qquad \text{Equation (11)}$$

Figure 10:
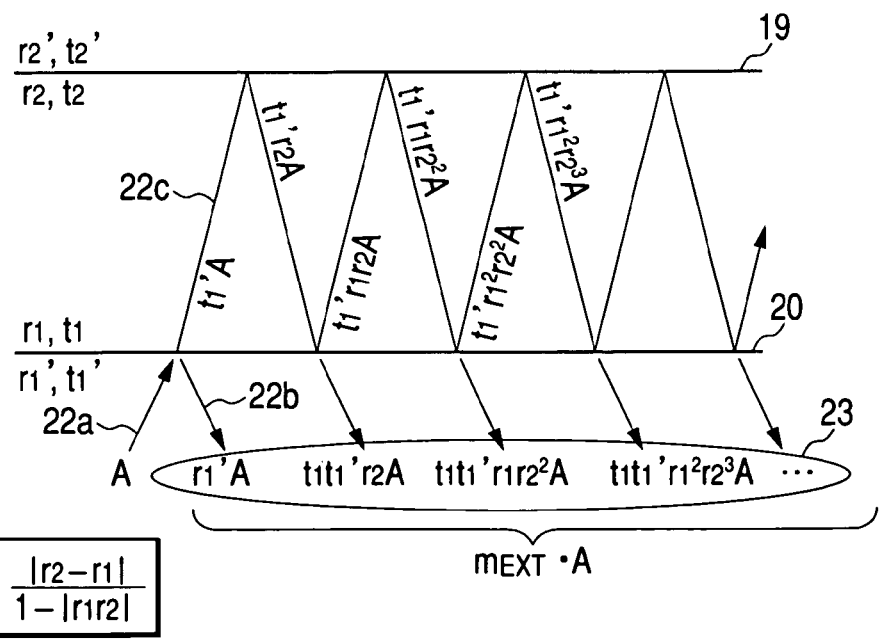
FIG. 10 is a conceptual view of the multiple interference phenomenon in the organic EL device about incident external light.

FIG. 10 is a conceptual view of the multiple interference phenomenon in the organic EL device regarding incident external light 22a. The light on the side of the viewer 7 includes a first reflected light beam 22b and synthesized light beams 23 which are incident to and permeate through the inside of the device and emerges externally from the device while repeating the multiple reflections. In the device in which the multiple-reflected light beams of the EL light emitted internally are adjusted to be in phase, all the synthesized light beams 23 are automatically in phase.

From the Fresnel formulas, the first reflected light beam 22b provides the reflectance $r_1$' with an inverted sign according to the relationship of refractivity between the medium of the incident side and the medium of the transmissive side. This means that the phase is shifted by p. Incidentally, the incident light beam 22a and permeating light beam 22c are always in phase.

Figure 11A:
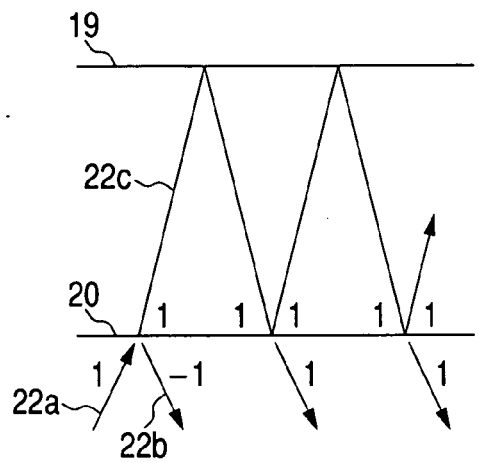
FIGS. 11A and 11B are views showing the inversion state of the phase of light.
Figure 11B:
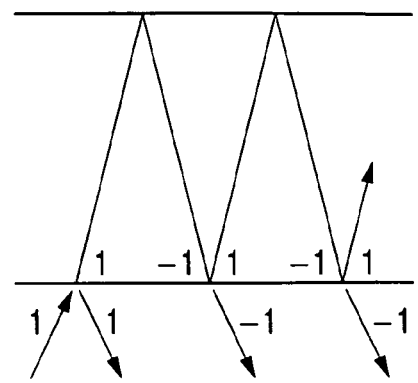

FIGS. 11A and 11B are views showing the inverting status of the phase of the light beam. The case where the phase is inverted is denoted by "−1", whereas the case whereas the phase is not inverted is denoted by "1". Since r=−r', when the reflection accompanying phase inversion occurs in a certain incidence direction, in the light incidence in the opposite direction, the phase is not inverted.

FIG. 11A is directed to the case where at the first reflection of the external light, its phase is inverted. In this case, the light within the device is reflected in phase on the front reflecting area 20. Specifically, the light which travels back and forth once between the front reflecting area 20 and a rear reflecting area 19 is adjusted to provide a phase difference of 2 mπ (m denotes a natural number) through propagation/reflection. This adjustment is identical to the optimizing of the device as explained already. The device adjusted so as to intensify the EL light is automatically adjusted in this manner.

FIG. 11B is directed to the case where at the first reflection of the external light, its phase is not inverted. In this case, the light within the device is reflected in an opposite phase on the front reflecting area 20. Specifically, the light which travels back and forth once between the front reflecting area 20 and a rear reflecting area 19 is adjusted to provide a phase difference of 2(m−1)π (m denotes a natural number) through propagation/reflection. The adjustment is identical to the aforementioned optimizing of the device. The device adjusted so as to intensify the EL light is automatically adjusted in this manner.

As described above, in the optimized EL device, in any case, in the first reflected light beam 22b and the penetrated synthesized light beams 23 in FIG. 10 are in opposite phase. The synthesized amplitudes of the penetrated synthesized light beams 23 can be expressed as follows.

$$t_1 t_2' r_2 (1 + r_1 r_2 + (r_1 r_2)^2 + \ldots) = t_1 t_1' r_2 / (1 - r_1 r_2) \quad \text{Equation (12)}$$

From the Equation (12), the external light synthesized amplitude reflectance $m_{EXT}$ which represents the ratio of the electric field amplitude of all the synthesized light waves in FIG. 10 to the electric-field amplitude A of the incident external light 22a can be expressed as follows.

$$m_{EXT} = |r_1' - t_1 t_1' r_2 / (1 - r_1 r_2)| \quad \text{Equation (13)}$$

By, using the relational expression $t_1 t_1' = T_1 = 1 - r_1^2$ and $|r_1'| = |r_1|$, Equation (13) can be rewritten as follows.

$$m_{EXT} = |r_1'| - |r_2|(1 - |r_1|^2)/(1 - |r_1 r_2|) \quad \text{Equation (14)}$$

$$= (|r_1 - r_2|)/(1 - |r_1 r_2|)$$

The explanation made hitherto is the general optical mode analysis of the organic EL device. In summary, using the reflectance $r_1$, $r_1'$ and transmittance $t_1$, $t_1'$ on the front reflecting area and the reflectance $r_2$ on the rear reflecting area, assuming that the electric-field amplitude of the internal EL light is E and the electric-field amplitude of the incident light is A, the electric-field amplitude $E_{OUT}$ of the EL light externally extracted and the electric-field amplitude $A_{REF}$ of the incident external light reflected externally can be expressed as follows.

$$E_{out} = m_{EL} \cdot E = \frac{1 + r_2}{1 - r_1 r_2} t_1 \cdot E \quad \text{Equation (15)}$$

$$A_{REF} = m_{EXT} \cdot A = \frac{|r_1 - r_2|}{1 - |r_1 r_2|} \cdot A \quad \text{Equation (16)}$$

In the case above, the optical intensity $I_{OUT}$ and $I_{REF}$ can be expressed by the square of the $E_{OUT}$ and $A_{REF}$. Particularly, the condition that $A_{REF}$ equals to 0 is when $r_1$ equals to $r_2$.

Regarding the Equation (15), the calculation result of the intensity ratio $M_{EL} = I_{OUT}/E^2$ in the range in which $r_1$ and $r_2$ are in a range of from 0 to 0.95 is shown in Table 1. Table 1 shows that the intensity reflectance $M_{EL}$ equals to value 1.00 on the columns on the diagonal line satisfying $r_1 = r_2$.

TABLE 1

EL Light Apparent Intensity Transmittance $M_{EL}$

| $r_2$ | \multicolumn{20}{c}{$r_1$} |
|---|---|---|---|---|---|---|---|---|---|---|---|---|---|---|---|---|---|---|---|---|
| | 0.00 | 0.05 | 0.10 | 0.15 | 0.20 | 0.25 | 0.30 | 0.35 | 0.40 | 0.45 | 0.50 | 0.55 | 0.60 | 0.65 | 0.70 | 0.75 | 0.80 | 0.85 | 0.90 | 0.95 |
| 0.00 | 1.00 | 0.90 | 0.81 | 0.72 | 0.64 | 0.56 | 0.49 | 0.42 | 0.36 | 0.30 | 0.25 | 0.20 | 0.16 | 0.12 | 0.09 | 0.06 | 0.04 | 0.04 | 0.01 | 0.00 |
| 0.05 | 1.10 | 1.00 | 0.90 | 0.81 | 0.72 | 0.64 | 0.56 | 0.48 | 0.41 | 0.35 | 0.29 | 0.24 | 0.19 | 0.14 | 0.11 | 0.07 | 0.05 | 0.05 | 0.01 | 0.00 |
| 0.10 | 1.21 | 1.10 | 1.00 | 0.90 | 0.81 | 0.72 | 0.63 | 0.55 | 0.47 | 0.40 | 0.34 | 0.27 | 0.22 | 0.17 | 0.13 | 0.09 | 0.06 | 0.06 | 0.01 | 0.00 |
| 0.15 | 1.32 | 1.21 | 1.10 | 1.00 | 0.90 | 0.80 | 0.71 | 0.62 | 0.54 | 0.46 | 0.39 | 0.32 | 0.26 | 0.20 | 0.15 | 0.10 | 0.07 | 0.07 | 0.02 | 0.00 |
| 0.20 | 1.44 | 1.33 | 1.21 | 1.11 | 1.00 | 0.90 | 0.80 | 0.70 | 0.61 | 0.53 | 0.44 | 0.37 | 0.30 | 0.23 | 0.18 | 0.12 | 0.08 | 0.08 | 0.02 | 0.01 |
| 0.25 | 1.56 | 1.45 | 1.33 | 1.22 | 1.11 | 1.00 | 0.89 | 0.79 | 0.69 | 0.60 | 0.51 | 0.43 | 0.35 | 0.27 | 0.21 | 0.15 | 0.10 | 0.10 | 0.03 | 0.01 |
| 0.30 | 1.69 | 1.57 | 1.45 | 1.34 | 1.22 | 1.11 | 1.00 | 0.89 | 0.79 | 0.68 | 0.58 | 0.49 | 0.40 | 0.32 | 0.24 | 0.18 | 0.12 | 0.12 | 0.03 | 0.01 |
| 0.35 | 1.82 | 1.70 | 1.59 | 1.47 | 1.35 | 1.23 | 1.11 | 1.00 | 0.89 | 0.78 | 0.67 | 0.57 | 0.47 | 0.37 | 0.29 | 0.21 | 0.14 | 0.14 | 0.04 | 0.01 |
| 0.40 | 1.96 | 1.84 | 1.72 | 1.60 | 1.48 | 1.36 | 1.24 | 1.12 | 1.00 | 0.88 | 0.77 | 0.65 | 0.54 | 0.44 | 0.34 | 0.25 | 0.17 | 0.17 | 0.05 | 0.01 |
| 0.45 | 2.10 | 1.99 | 1.87 | 1.75 | 1.62 | 1.50 | 1.38 | 1.25 | 1.13 | 1.00 | 0.88 | 0.75 | 0.63 | 0.51 | 0.40 | 0.30 | 0.21 | 0.21 | 0.06 | 0.02 |
| 0.50 | 2.25 | 2.14 | 2.02 | 1.90 | 1.78 | 1.65 | 1.53 | 1.40 | 1.27 | 1.13 | 1.00 | 0.87 | 0.93 | 0.60 | 0.48 | 0.36 | 0.25 | 0.25 | 0.07 | 0.02 |
| 0.55 | 2.40 | 2.29 | 2.18 | 2.06 | 1.94 | 1.82 | 1.69 | 1.56 | 1.42 | 1.28 | 1.14 | 1.00 | 0.86 | 0.71 | 0.57 | 0.44 | 0.31 | 0.31 | 0.09 | 0.03 |
| 0.60 | 2.56 | 2.46 | 2.35 | 2.23 | 2.12 | 1.99 | 1.87 | 1.73 | 1.60 | 1.45 | 1.31 | 1.15 | 1.00 | 0.84 | 0.68 | 0.53 | 0.38 | 0.38 | 0.12 | 0.03 |
| 0.65 | 2.72 | 2.62 | 2.52 | 2.41 | 2.30 | 2.18 | 2.06 | 1.93 | 1.79 | 1.65 | 1.49 | 1.34 | 1.17 | 1.00 | 0.82 | 0.65 | 0.47 | 0.47 | 0.16 | 0.05 |
| 0.70 | 2.89 | 2.80 | 2.71 | 2.61 | 2.50 | 2.39 | 2.27 | 2.14 | 2.01 | 1.86 | 1.71 | 1.55 | 1.37 | 1.19 | 1.00 | 0.80 | 0.60 | 0.60 | 0.21 | 0.06 |
| 0.75 | 3.06 | 2.98 | 2.90 | 2.81 | 2.71 | 2.61 | 2.50 | 2.38 | 2.25 | 2.11 | 1.96 | 1.80 | 1.62 | 1.43 | 1.22 | 1.00 | 0.77 | 0.77 | 0.29 | 0.09 |
| 0.80 | 3.24 | 3.17 | 3.10 | 3.02 | 2.94 | 2.85 | 2.75 | 2.64 | 2.52 | 2.39 | 2.25 | 2.09 | 1272 | 1.72 | 1.51 | 1.27 | 1.00 | 1.00 | 0.41 | 0.14 |
| 0.85 | 3.42 | 3.37 | 3.31 | 3.25 | 3.18 | 3.10 | 3.02 | 2.93 | 2.83 | 2.72 | 2.59 | 2.44 | 2.28 | 2.09 | 1.88 | 1.63 | 1.34 | 1.34 | 0.62 | 0.23 |
| 0.90 | 3.61 | 3.57 | 3.53 | 3.49 | 3.44 | 3.38 | 3.32 | 3.25 | 3.17 | 3.08 | 2.98 | 2.87 | 2.73 | 2.57 | 2.37 | 2.14 | 1.84 | 1.84 | 1.00 | 0.43 |
| 0.95 | 3.80 | 3.78 | 3.76 | 3.74 | 3.71 | 3.68 | 3.64 | 3.61 | 3.56 | 3.51 | 3.45 | 3.38 | 3.29 | 3.18 | 3.05 | 2.88 | 2.64 | 2.64 | 1.81 | 1.00 |

Further, regarding Equation (16), the calculation result of the intensity ratio $M_{EXT}=I_{REF}/A^2$ in a range in which $r_1$ and $r_2$ are from 0 to 0.95, respectively is shown in Table 2. Table 2 shows that the intensity reflectance $M_{EXT}=0$ on the columns on the diagonal line satisfying $r_1=r_2$.

obtained when the distance between the interface and light emitting layer is adjusted to intensify the EL light optically.

The electric-field amplitude reflectance $r_1$ at the interface between ITO (refractivity n=1.93) and glass (refractivity n=1.52) is expressed as follows.

TABLE 2

External light Apparent Intensity Reflectance $M_{EXT}$

| $r_2$ \ $r_1$ | 0.00 | 0.05 | 0.10 | 0.15 | 0.20 | 0.25 | 0.30 | 0.35 | 0.40 | 0.45 | 0.50 |
|---|---|---|---|---|---|---|---|---|---|---|---|
| 0.00 | 0.0% | 0.3% | 1.0% | 2.3% | 4.0% | 6.3% | 9.0% | 12.3% | 16.0% | 20.3% | 25.0% |
| 0.05 | 0.3% | 0.0% | 0.3% | 1.0% | 2.3% | 4.1% | 6.4% | 9.3% | 12.8% | 16.7% | 21.3% |
| 0.10 | 1.0% | 0.3% | 0.0% | 0.3% | 1.0% | 2.4% | 4.3% | 6.7% | 9.8% | 13.4% | 17.7% |
| 0.15 | 2.3% | 1.0% | 0.3% | 0.0% | 0.3% | 1.1% | 2.5% | 4.5% | 7.1% | 10.4% | 14.3% |
| 0.20 | 4.0% | 2.3% | 1.0% | 0.3% | 0.0% | 0.3% | 1.1% | 2.6% | 4.7% | 7.5% | 11.1% |
| 0.25 | 6.3% | 4.1% | 2.4% | 1.1% | 0.3% | 0.0% | 0.3% | 1.2% | 2.8% | 5.1% | 8.2% |
| 0.30 | 9.0% | 6.4% | 4.3% | 2.5% | 1.1% | 0.3% | 0.0% | 0.3% | 1.3% | 3.0% | 5.5% |
| 0.35 | 12.3% | 9.3% | 6.7% | 4.5% | 2.6% | 1.2% | 0.3% | 0.0% | 0.3% | 1.4% | 3.3% |
| 0.40 | 16.0% | 12.8% | 9.8% | 7.1% | 4.7% | 2.8% | 1.3% | 0.3% | 0.0% | 0.4% | 1.6% |
| 0.45 | 20.3% | 16.7% | 13.4% | 10.4% | 7.5% | 5.1% | 3.0% | 1.4% | 0.4% | 0.0% | 0.4% |
| 0.50 | 25.0% | 21.3% | 17.7% | 14.3% | 11.1% | 8.2% | 5.5% | 3.3% | 1.6% | 0.4% | 0.0% |
| 0.55 | 30.3% | 26.4% | 22.7% | 19.0% | 15.5% | 12.1% | 9.0% | 6.1% | 3.7% | 1.8% | 0.5% |
| 0.60 | 36.0% | 32.2% | 28.3% | 24.5% | 20.7% | 17.0% | 13.4% | 10.0% | 6.9% | 4.2% | 2.0% |
| 0.65 | 42.3% | 38.5% | 34.6% | 30.7% | 26.8% | 22.8% | 18.9% | 15.1% | 11.4% | 8.0% | 4.9% |
| 0.70 | 49.0% | 45.4% | 41.6% | 37.8% | 33.8% | 29.8% | 25.6% | 21.5% | 17.4% | 13.3% | 9.5% |
| 0.75 | 56.3% | 52.9% | 49.4% | 45.7% | 41.9% | 37.9% | 33.7% | 29.4% | 25.0% | 20.5% | 16.0% |
| 0.80 | 64.0% | 61.0% | 57.9% | 54.6% | 51.0% | 47.3% | 43.3% | 39.1% | 34.6% | 29.9% | 25.0% |
| 0.85 | 72.3% | 69.8% | 67.2% | 64.4% | 61.3% | 58.0% | 54.5% | 50.7% | 46.5% | 42.0% | 37.1% |
| 0.90 | 81.0% | 79.2% | 77.3% | 75.2% | 72.9% | 70.3% | 67.6% | 64.5% | 61.0% | 57.2% | 52.9% |
| 0.95 | 90.3% | 89.3% | 88.2% | 87.0% | 85.7% | 84.3% | 82.6% | 80.8% | 78.7% | 76.3% | 73.5% |

| $r_2$ \ $r_1$ | 0.55 | 0.60 | 0.65 | 0.70 | 0.75 | 0.80 | 0.85 | 0.90 | 0.95 |
|---|---|---|---|---|---|---|---|---|---|
| 0.00 | 30.3% | 36.0% | 42.3% | 49.0% | 56.3% | 64.0% | 72.3% | 81.0% | 90.3% |
| 0.05 | 26.4% | 32.2% | 38.5% | 45.4% | 52.9% | 61.0% | 69.8% | 79.2% | 89.3% |
| 0.10 | 22.7% | 28.3% | 34.6% | 41.6% | 49.4% | 57.9% | 67.2% | 77.3% | 88.2% |
| 0.15 | 19.0% | 24.5% | 30.7% | 37.8% | 45.7% | 54.6% | 64.4% | 75.2% | 87.0% |
| 0.20 | 15.5% | 20.7% | 26.8% | 33.8% | 41.9% | 51.0% | 61.3% | 72.9% | 85.7% |
| 0.25 | 12.1% | 17.0% | 22.8% | 29.8% | 37.9% | 47.3% | 58.0% | 70.3% | 84.3% |
| 0.30 | 9.0% | 13.4% | 18.9% | 25.6% | 33.7% | 43.3% | 54.5% | 67.6% | 82.6% |
| 0.35 | 6.1% | 10.0% | 15.1% | 21.5% | 29.4% | 39.1% | 50.7% | 64.5% | 80.8% |
| 0.40 | 3.7% | 6.9% | 11.4% | 17.4% | 25.0% | 34.6% | 46.5% | 61.0% | 78.7% |
| 0.45 | 1.8% | 4.2% | 8.0% | 13.3% | 20.5% | 29.9% | 42.0% | 57.2% | 76.3% |
| 0.50 | 0.5% | 2.0% | 4.9% | 9.5% | 16.0% | 25.0% | 37.1% | 52.9% | 73.5% |
| 0.55 | 0.0% | 0.6% | 2.4% | 5.9% | 13.6% | 19.9% | 31.7% | 48.0% | 70.2% |
| 0.60 | 0.6% | 0.0% | 0.7% | 3.0% | 7.4% | 14.8% | 26.0% | 42.5% | 66.3% |
| 0.65 | 2.4% | 0.7% | 0.0% | 0.8% | 3.8% | 9.8% | 20.0% | 36.3% | 61.5% |
| 0.70 | 5.9% | 3.0% | 0.8% | 0.0% | 1.1% | 5.2% | 13.7% | 29.2% | 55.7% |
| 0.75 | 11.6% | 7.4% | 3.8% | 1.1% | 0.0% | 1.6% | 7.6% | 21.3% | 48.4% |
| 0.80 | 19.9% | 14.8% | 9.8% | 5.2% | 1.6% | 0.0% | 2.4% | 12.8% | 39.1% |
| 0.85 | 31.7% | 26.0% | 20.0% | 13.7% | 7.6% | 2.4% | 0.0% | 4.5% | 27.0% |
| 0.90 | 48.0% | 42.5% | 36.3% | 29.2% | 21.3% | 12.8% | 4.5% | 0.0% | 11.9% |
| 0.95 | 70.2% | 66.3% | 61.5% | 55.7% | 48.4% | 39.1% | 27.0% | 11.9% | 0.0% |

The results shown in Table 2 will be applied to Examples 1 and 2. In Example 2, the front reflecting area reflectance r1 can be estimated as follows. In Example 2, the planes which can be a highly reflective front plane are organic material/ITO/glass interfaces. Particularly, since there is a large difference in the refractivity at the ITO/glass interface whereas there is a small difference in the refractivity at the organic material/ITO interface, the ITO/glass interface can be the front reflecting area. The fact above can be considered reasonable because that there has been verified experimentally that the maximum EL light extracting efficiency is $$r_2 = (n_{ITO} - n_{glass})/(n_{ITO} + n_{glass}) \quad \text{Equation (17)}$$

$$= (1.93 - 1.52)/(1.93 + 1.52)$$

$$= 0.119$$

Since the reflection/transmission phenomenon with no absorption is at issue, it can be assumed that $t_1=1-r_1$.

The rear reflecting area is the interface between the aluminum, which serves as the metallic electrode and the organic material. Since the electric-field amplitude reflectance at the Alq/Al interface is 92.5%, if $(r_1, r_2)=(0.119, 0.925)$ is substituted for Equation (9), and the square is taken, the extraction coefficient $M_{EL}$ of the EL light intensity can be expressed as follows.

$$M_{EL}=(m_{EL})^2=1.9062=3.63 \qquad \text{Equation (18)}$$

The same calculation is made for Example 1. Since the backside electrode is made non-reflective, assuming that $(r_1, r_2)=(0.119, 0)$, $M_{EL}$ is expressed as follows.

$$M_{EL}=(m_{EL})^2=0.8892=0.78 \qquad \text{Equation (19)}$$

As can be seen from FIG. 7, the brightness in Example 1 is 0.23 times as large as that in Example 2. This is approximately equal to the calculation result of the ratio between the extraction coefficients $M_{EL}$, i.e. 0.78/3.63=0.21.

EXAMPLE 3

As Example 3, an organic EL device with the measured intensity reflectance R=0.12, i.e. $r_2=(0.12)^{1/2}=0.346$ was made, like Example 1, by adjusting the thickness of the $Alq_3$ layer which is the second transparent layer of the non-reflective electrode. In the external light EL light intensity is 154 cd/m² and the brightness ratio to that in Example 2 was 0.48.

When $(r_1, r_2)=(0.119, 0.346)$ is substituted for Equation (9), and the square is taken, the extraction coefficient $M_{EL}$ of the EL light intensity can be expressed as follows.

$$M_{EL}=(m_{EL})^2=1.2372=1.531$$

Therefore, its ratio to the calculated value in Example 2 is 1.531/3.63=0.422. This value is substantially equivalent to the actual brightness 0.48. Table 3 shows the measured results in Examples 1 to 3. As can be seen, the calculated value and the measured value are fairly identical to each other.

TABLE 3

| Electric Field Reflectance | | EL Light External Extracting Intensity | | Intensity Ratio Normalized by Example 2 | |
|---|---|---|---|---|---|
| | | Calculated | Measured | | |
| $r_1$ | $r_2$ | Value | Value: 7.5 mA/cr | Calculated Value | Measured Value |
| Example 1  0.119 | 0 | 0.78 | 77 | 0.215 | 0.24 |
| Example 2  0.119 | 0.925 | 3.63 | 312 | 1 | 1 |
| Example 3  0.119 | 0.346 | 1.53 | 154 | 0.422 | 0.48 |

EXAMPLES 4 AND 5

As Example 4, the non-reflective laminated structure was made on the same condition as Example 3, and its reflectance was measured. As Example 4, the EL device having the glass/non-reflective laminated structure was made and as Example 5, the EL device having glass/ITO/non-reflective laminated structure was made. The intensity reflectance in the Examples 4 and 5 were measured.

In Example 5, the intensity reflectance was about 10%. Therefore, the amplitude reflectance of the non-reflective laminated structure can be estimated as $(0.1)^{1/2}=0.316$. In Example 4, the intensity reflectance was about 5%. On the basis of Example 5, the external light reflectance in Example 4 was calculated by substituting $(r_1, r_2)=(0.119, (0.1)^{1/2})=(0.119, 0.316)$ for Equation (14). Its value $M_{EXT}=(m_{EXT})^2=4.19\%$ which is fairly identical to the measured value about 5%.

Table 2 shows that in the organic EL device, $(r_1, r_2)$ giving non-reflectance to the external light is $r_1=r_2$. Table 1 shows that at $r_1=r_2$, the extraction coefficient of the EL light $M_{EL}=1$.

Now, in the case of $(r_1, r_2)=(0.1, 0.35)$, $M_{EL}=1.59$ and $M_{EXT}=6.7\%$ can be obtained. It can be seen that the EL efficiency could be improved 1.96 times as large as $M_{EL}=0.81$ and $M_{EXT}=1.0\%$ in the case of $(r_1, r_2)=(0.1, 0)$.

EXAMPLE 6

As for Example 6, a plurality of organic EL devices with an electrode having intensity reflectance changed, as Example 4, by adjusting the thickness of a thin aluminum layer which is the first transparent layer of the non-reflective electrode, is made as Example 1.

Figure 12:
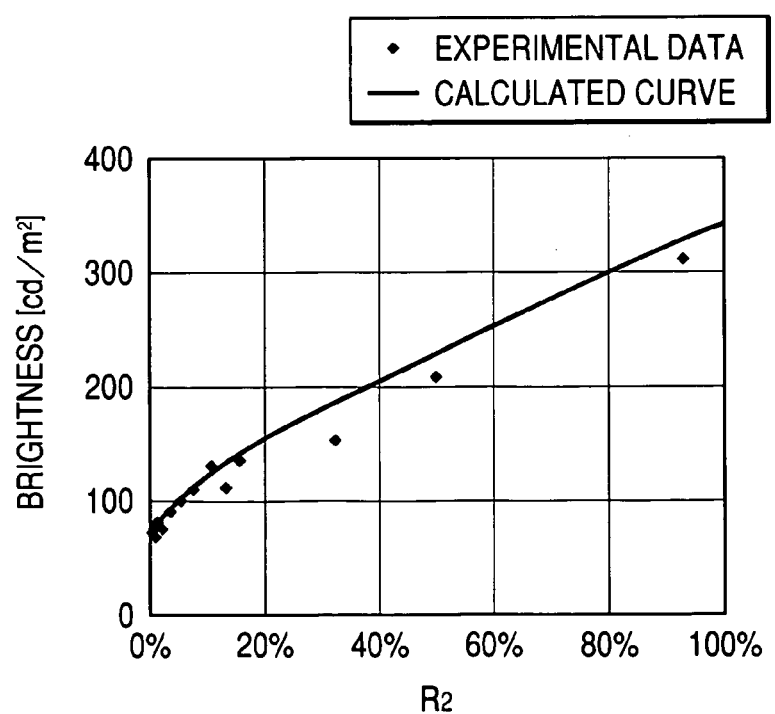
FIG. 12 shows the distribution of brightness efficiency and curve calculated by Equation (9)

FIG. 12 shows the distribution of brightness efficiency and curve calculated by Equation (9). As seen from FIG. 12, for various $R_2=(r_2)^2$, the EL intensity of an actual device is fairly identical to the calculation result in Equation (9).

As seen from FIG. 12, when the rear intensity reflectance increases from 0 to 10%, the brightness increases greatly by 1.79 times from about 70 cd/m² to 125 cd/m². Namely, the device efficiency of the organic EL device increases approximately twice. In this way, compared to the case where the rear reflectance is 0, it can be seen that even if the rear intensity reflectance increases slightly, the device efficiency increases greatly.

Now referring to Tables 1 and 2, comparison is made between the case of non-reflection of the external light and the case of slight remaining reflection. As can be seen from Table 2, in the organic EL device, $(r_1, r_2)$ which gives non-reflectance to the external light is $r_1=r_2$. As can be seen from Table 1, when $r_1=r_2$, the extraction coefficient of the EL light $M_{EL}$ equals to 1 ($M_{EL}=1$).

Now, assuming that $(r_1, r_2)=(0.1, 0.35)$ (there is remaining reflection), $M_{EL}=1.59$, $M_{EXT}=6.7\%$. This shows that the extraction efficiency of the EL light is increased by 1.96 times as compared with $M_{EL}=0.81$ and $M_{EXT}=1.0\%$ in the case where $(r_1, r_2)=(0.1, 0)$. Thus, it can be understood that where there is the slight remaining reflection, the extraction efficiency of the EL light is greatly improved as compared with the case of non-reflection of the external light.

It is desired that the intensity reflection coefficient R2 in the rear reflection area is adjusted so that the external light intensity reflectance $M_{EXT}$ in the display seen from a viewer is 10% or less owing to optical interference effect. It is preferred that the intensity reflectance $R_2$ is adjusted in a range of from 5% to 50% in order to intensify the efficiency of externally extracting the EL light. When the external light intensity reflectance $M_{EXT}$ in the display seen from a viewer exceeds 10%, the increase in the external light reflectance plays a greater role than the increase in the extraction efficiency of the organic EL light, thereby deteriorating the visibility of the display.

The combinations of $(r_1, r_2)$ which satisfies the condition that the external light intensity reflectance $M_{EXT}$ in the display seen from a viewer is 10% or less are the numerical values within the range in the vicinity of the diagonal line which can be drawn from the upper left corner to the lower right corner in Table 2. On the basis of Equation (16), this range can be expressed by the following Equations (20) and (21).

$$\left(\frac{r_1 - r_2}{1 - r_1 r_2}\right)^2 \leq 0.1 \qquad \text{Equation (20)}$$

$$\left(\frac{\sqrt{R_1} - \sqrt{R_2}}{1 - \sqrt{R_1 R_2}}\right)^2 \leq 0.1 \qquad \text{Equation (21)}$$

When the numerical values within this range are selected to improve the intensity transmittance $M_{EL}$ of the EL light with reference to Table 1, the display with the reflectance of the external light suppressed and the light emitting intensity of the EL light increased can be acquired. Preferably, among the parameters located on the lower left side of the diagonal line which can be drawn from the upper left corner to the lower right corner in Table 1, the parameters may be selected which provide the external light intensity reflectance $M_{EXT}$ of 10% or less. Referring to Table 1, this range can be expressed by the following Equations (22) and (23).

$$r_1 \leq r_2 \qquad \text{Equation (22)}$$

$$R_1 \leq R_2 \qquad \text{Equation (23)}$$

In summary, the display is preferably adjusted so that the external light intensity reflectance $M_{EXT}$ is 10% or less, and parameters $r_1$ and $r_2$, or $R_1$ and $R_2$ satisfy the condition: $r_1 \leq r_2$, i.e. $R_1 \leq R_2$. Such a display which satisfies the above condition can be the display with the reflectance of the external light suppressed and the light emitting intensity of the EL light increased. In this configuration, the light emitting intensity of the organic EL display can be increased in the state where the current flowing through the organic layer has been decreased.

(First Embodiment)

Now referring to FIG. 13, an explanation will be given of a first embodiment according to the invention.

Figure 13:
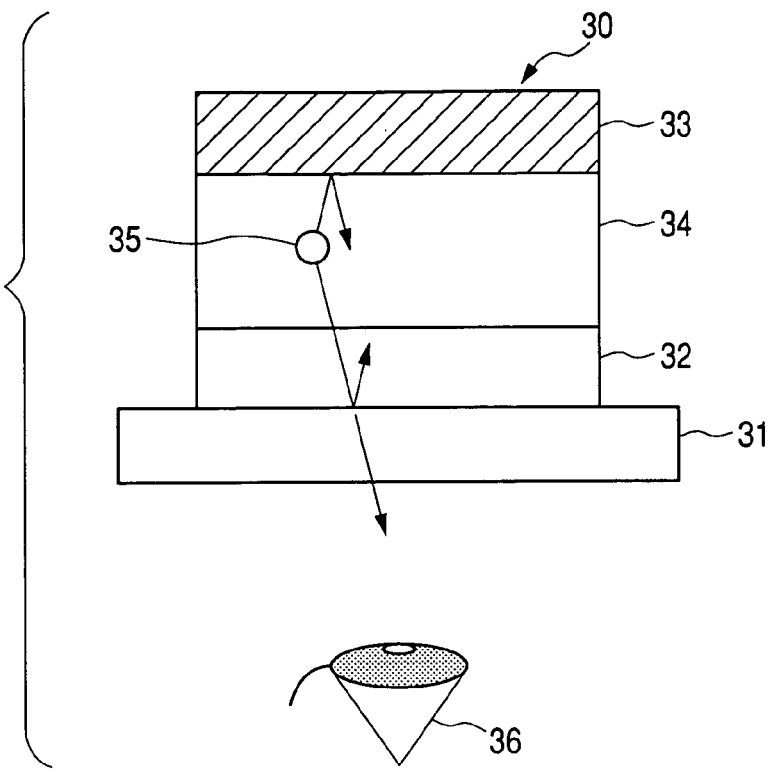
FIG. 13 is a view showing an organic EL device according to a first embodiment of the invention.

FIG. 13 is a view showing an organic EL device 30 according to the first embodiment. The organic EL device 30 includes a glass substrate 31, a transparent electrode 32 arranged on the glass substrate 31, an organic layer 34 consisting of a plurality of layers successively stacked on the transparent electrode 32 and a backside electrode 33 stacked on the organic layer 34. Application of a voltage between the transparent electrode 32 and the backside electrode 33 injects positive and negative carriers into the device, and the re-combination of these carriers generates the electroluminescence within the organic layer 34. Reference numeral 35 denotes one of light emitting sources which emit the light in the organic layer 34 when the excited organic molecules returns to the ground state, and has a size corresponding to approximately a single molecule. The light emitting sources 35 are distributed infinitely as a layer. The luminescent light emitted from the infinite number of light emitting sources 35 are emitted directly or by multiple reflection within the device toward a viewer 36 through the transparent electrode 32 and the glass substrate 31.

In the first embodiment, between the interface between the backside electrode 33 and the organic layer 34, and the light emitting intensity peak position of the light emitting source 35, and between the interface between the transparent electrode 32 and the substrate 31, and the light emitting intensity peak position of the light emitting source 35, optical distances are selected so as to increase all the multiply-reflected light beams within the device.

In the first embodiment, the transparent electrode 32 is made of indium tin oxide (ITO). However, the transparent electrode 32 may be made of other transparent conductive films.

The electric field amplitude reflectance $r_1$ at the interface between the transparent electrode 32 and the glass substrate 31 can be estimated at 0.119. The electric filed amplitude reflectance at the interface between the transparent electrode 32 and the organic layer 34 of 0.043, which is smaller than 0.119, is negligible. The electric field amplitude reflectance $r_2$ at the interface between the organic layer 28 and the backside electrode 27 can be estimated at 0.346. In this case, the measured $M_{EL}$ and $M_{EXT}$ are 1.531 and 3.63%. In a case where $r_2$ equals 0, since $M_{EL}$ is approximately 0.8, the brightness of the EL light emitting intensity is increased approximately twice. In the first embodiment, the condition for improving the extraction coefficient $M_{EL}$ of the EL light is $r_1 \leq r_2$ from Table 1 and 2. In addition, when $r_2$ is 0.4 or less, the device with the external light intensity $M_{EXT}$ of 10% or less can be obtained.

In the first embodiment, in a case where the external light intensity $M_{EXT}$ is adjusted to 10% or less, particularly, approximately 0, the organic EL device itself becomes a non-reflector having a non-reflecting structure. In this way, in the first embodiment, using the reflecting plane formed on the side nearer than the light emitting layer to the viewer and the reflecting plane formed on the side farther than the light emitting layer from the viewer, a low reflecting structure or non-reflecting structure has been realized.

(Second Embodiment)

Figure 14:
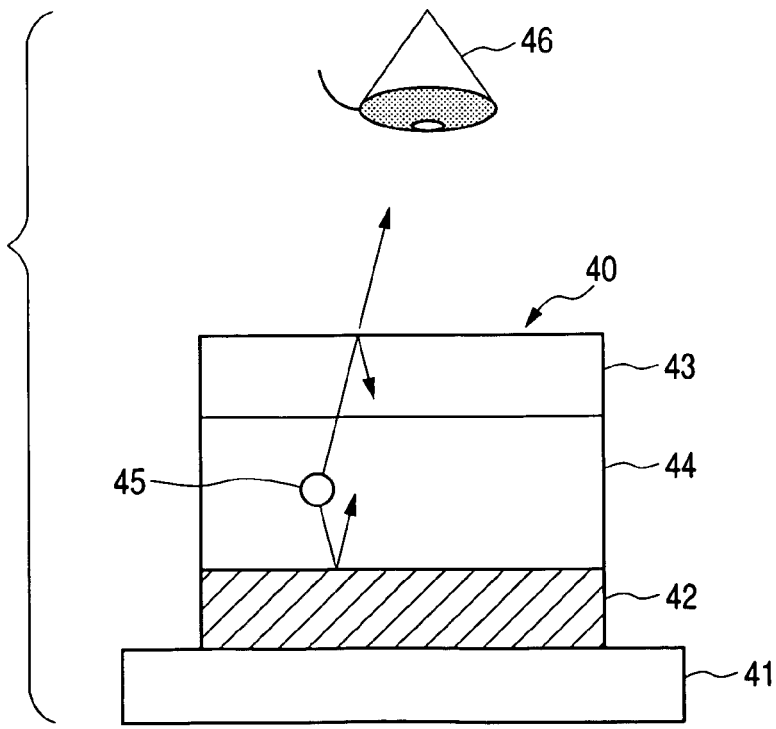
FIG. 14 is a view showing an organic EL device according to a second embodiment of the invention.

The first embodiment relates to the case where the EL light is extracted toward the substrate. The above contemplation applies, as it is, to a top emission type EL organic EL device which extracts the EL light toward the side opposite to the substrate. FIG. 14 is a view showing the top emission type EL organic EL device. Referring to FIG. 14, a detailed explanation will be given of the top emission type EL organic EL device.

The top emission type organic EL device 40 includes a substrate 41, a backside electrode 42 arranged on the substrate 41, an organic layer 44 consisting of a plurality of layers successively stacked on the backside electrode 42 and a transparent electrode 43 stacked on the organic layer 44. The transparent electrode 43 may be a laminated structure consisting of a transparent metal and a conductive oxide film. The transparent electrode 43 is made of sputtered ITO.

The electric-field amplitude reflectance $r_1$ on the front electrode when the EL light is extracted from the transparent electrode 43 into the air is expressed by the following equation.

$$r_1 = (n_{ITO} - n_{air})/(n_{ITO} + n_{air})$$
$$= (1.93 - 1.0)/(1.93 + 1.0)$$
$$= 0.317$$

Table 4 shows the relationship among the electric-field amplitude reflectance $r_2$ and intensity reflectance $R_2$ on the rear (substrate side) and external intensity reflectance $M_{EXT}$ and the EL intensity extraction coefficient $M_{EL}$.

TABLE 4

| r$_2$ | R$_2$ | M$_{EXT}$ | M$_{EL}$ |
|---|---|---|---|
| 0 | 0 | 0.100 | 0.407 |
| 0.317 | 0.100 | 0.0 | 1.00 |
| 0.575 | 0.331 | 0.1 | 1.73 |

The condition for setting the external light intensity reflectance M$_{EXT}$ at 10% can be solved noting the sign of Equation (14). This corresponds to R$_2$=0% and 33.1%. In a case above, by applying the condition R$_1$=R$_2$, the EL light intensity extraction coefficient can be set at 1.73. This value is equal to 4.25 times as large as in the case of the intensity reflectance R$_2$=0% at the backside electrode.

(Modified Embodiment)

Figure 15:
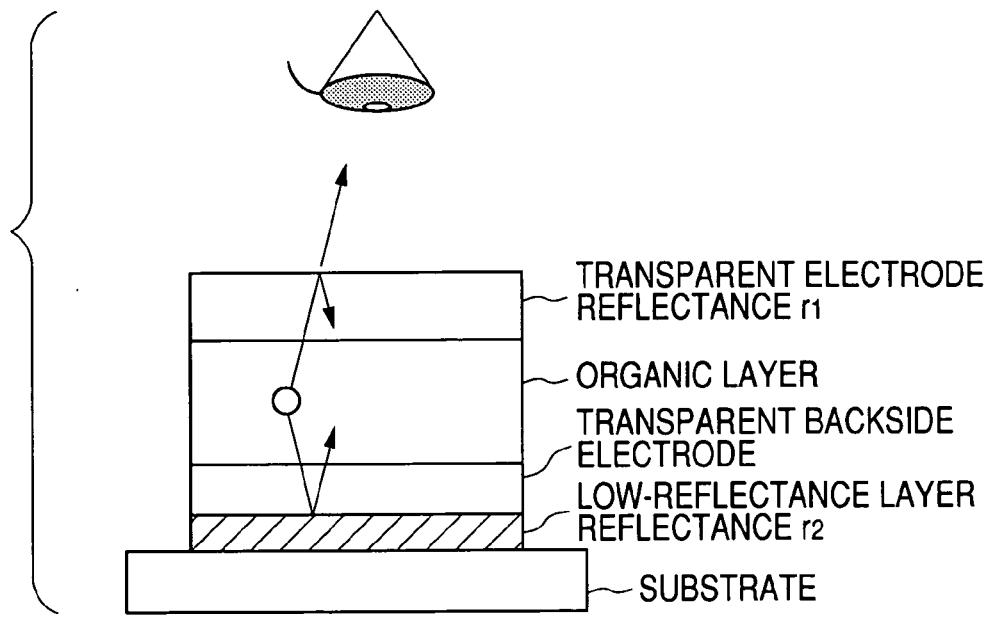
FIG. 15 is a view showing an organic EL device according to a first modification of the second embodiment.

In the top emission type organic EL device, as shown in FIG. 15, the backside electrode may be a laminated structure consisting of a transparent conductive film and a lowly-reflective film.

In other words, in the transparent type organic EL device with both electrodes being transparent, also where an absorptive film is applied on the rear plane opposite to the light extracting side, r$_2$ can be taken as the reflectance.

Figure 16:
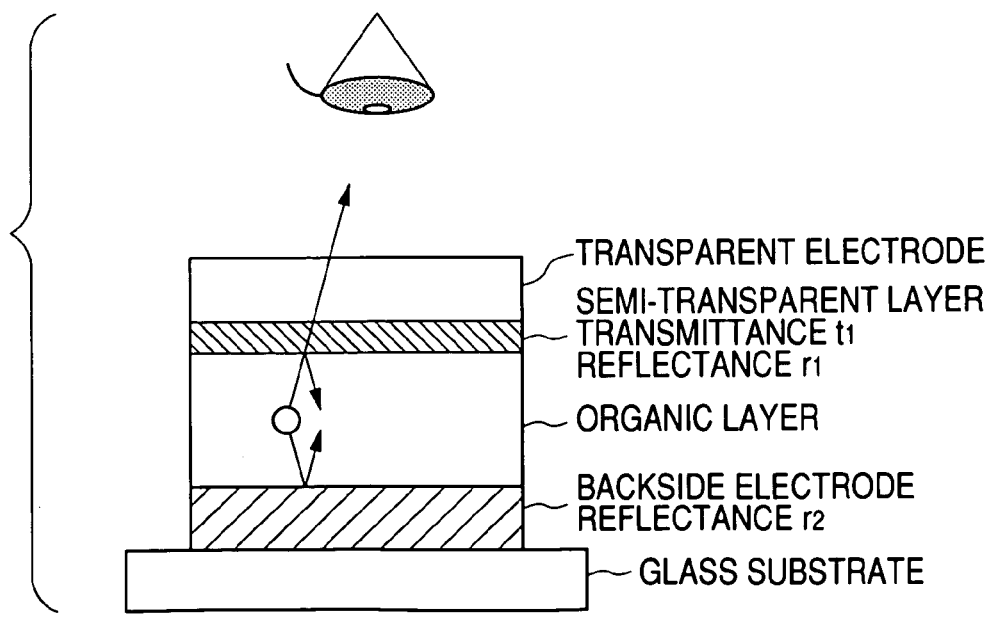
FIG. 16 is a view showing an organic EL device according to a second modification of the second embodiment.
Figure 17:
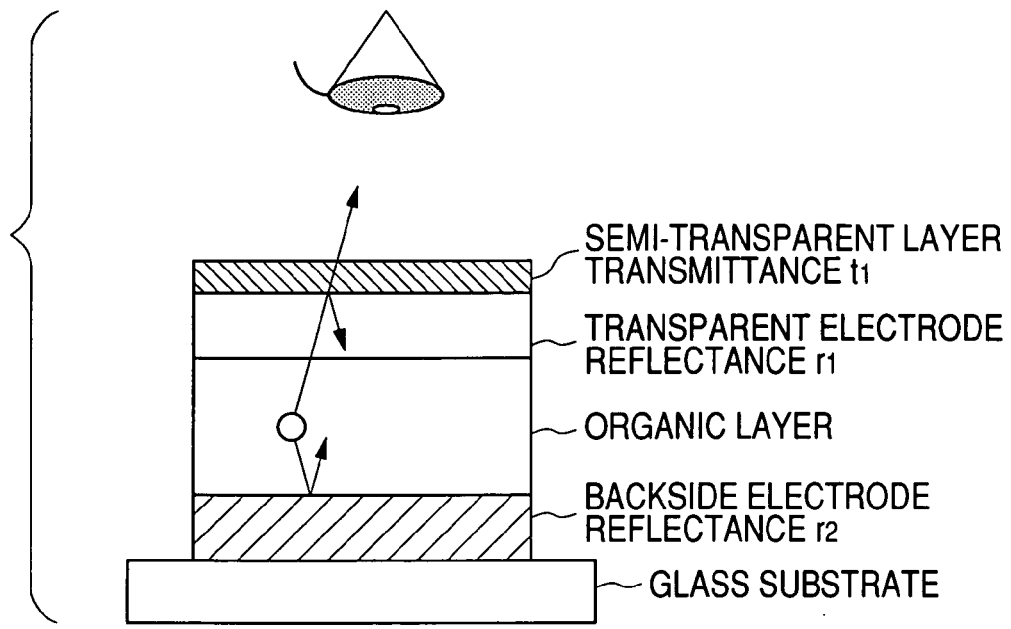
FIG. 17 is a view showing an organic EL device according to a third modification of the second embodiment.

In the top emission type organic EL device, as shown in FIGS. 16 and 17, the light extracting electrode may be a laminated structure consisting of a transparent conductive film and semi-transparent film. Equation (14) relates to the case where the absorption of energy at the first reflecting plane from the external light is zero. However, another absorption layer may be formed at the interface for adjusting t$_1$ independently from r$_1$.

Figure 18:
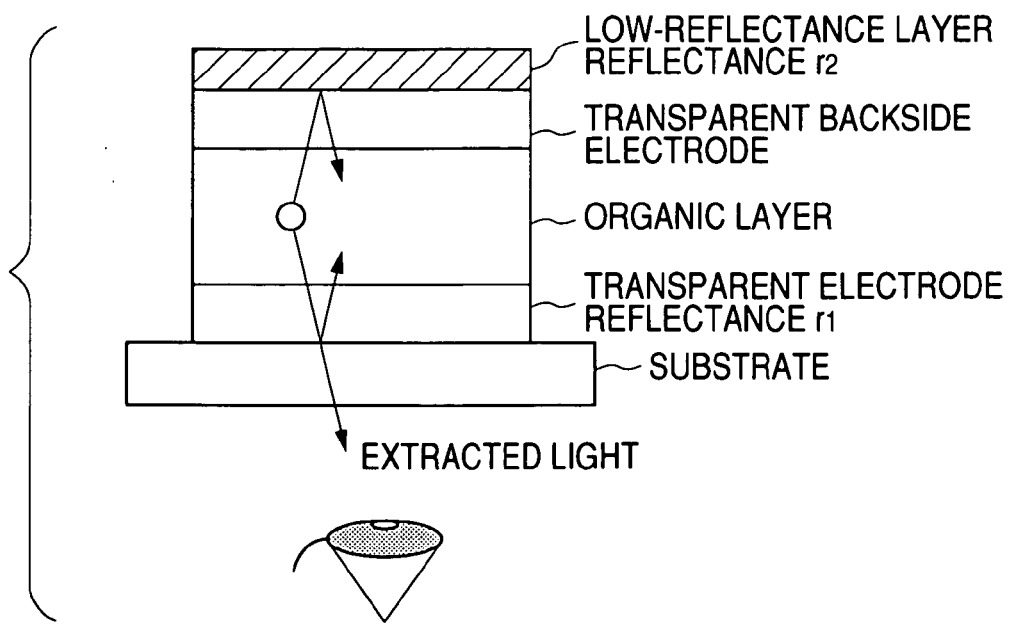
FIG. 18 is a view showing an organic EL device according to a fourth modification of the second embodiment.

As the device format similar to Example 1, as shown in FIG. 18, the backside electrode may be formed of a laminated structure consisting of a transparent conductive film and a lowly-reflective film.

Figure 19:
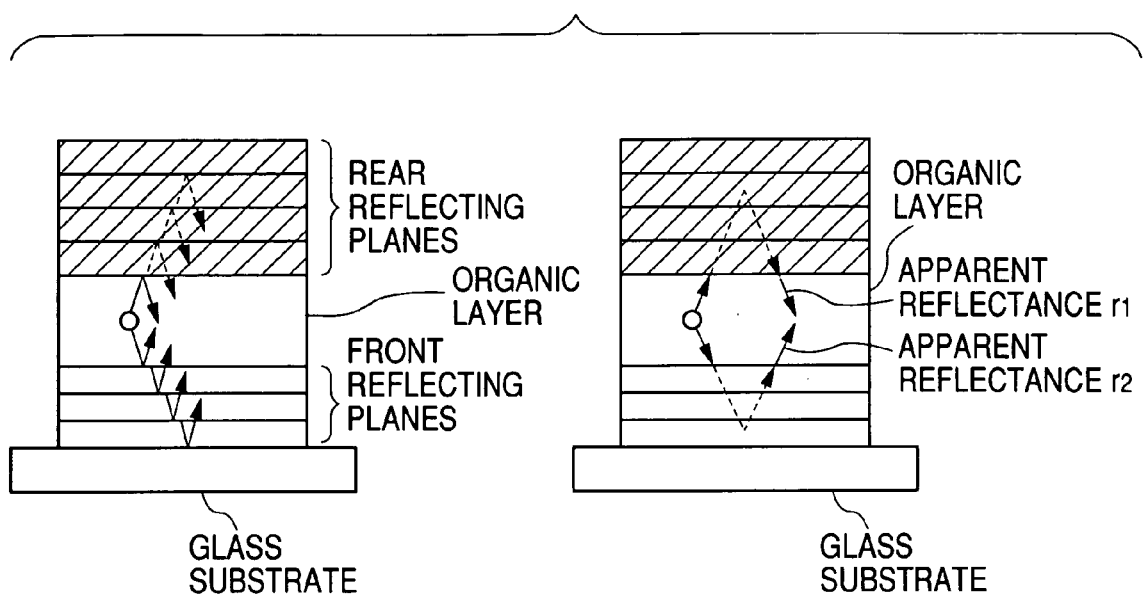
FIG. 19 is a view showing an organic EL device according to a fifth modification of the second embodiment.

As shown in FIG. 19, where there are a plurality of reflecting planes on the rear surface or front surface, the sum of the light beams from all the reflecting planes located at the rear surface or front surface may be defined as the reflected light, and the change in the electric field amplitude may be defined as r$_1$ or r$_2$.

Figure 20A:
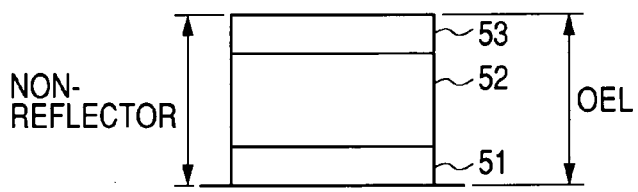
FIGS. 20A and 20B are views showing an organic EL device according to a fifth modification of the second embodiment.

As shown in FIG. 20A, the structure of the non-reflector (i.e. laminated optical structure with a low reflectance and a low transmittance) may be an organic EL device itself. In FIG. 20, a transparent electrode 51, which is made of a semi-transparent film, is located on the substrate. A semi-transparent organic EL layer 52 having at least a light emitting layer is stacked on the organic EL layer 52. A reflective backside electrode 53 is stacked on the organic EL layer 52.

In above arrangement, the transparent electrode 51, organic EL layer 52 and backside electrode 53 constitute a non-reflector which is adjusted to cancel the external light incident from the side of the substrate by its optical interference with the reflected light beams at the interfaces between the adjacent layers. In such an organic EL device, r1 and r2 may be adjusted to set the external light intensity reflectance M$_{EXT}$ at 10% or less.

It is needless to say that the above arrangement can be applied to the top emission type organic EL device in such a manner that the electrode 51 arranged on the substrate is a reflective backside electrode and the electrode 53 is a semi-transparent electrode.

In this way, in a case where the organic EL device itself is constituted as the non-reflector, it is not necessary to provide separately a semi-transparent member or optical reflective film so that the organic EL device can be low-profiled. Since other members are not required, the manufacturing process can be simplified and the production efficiency can be improved.

Figure 20B:
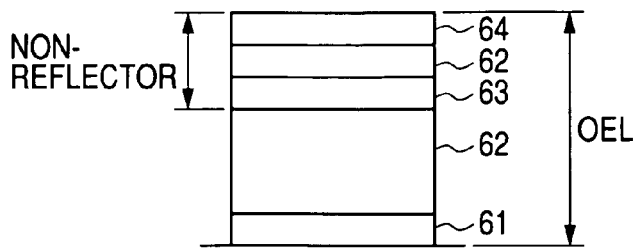

As shown in FIG. 20B, the structure of the non-reflector (i.e. laminated optical structure with a low reflectance and a low transmittance) may include a portion of the organic EL device so that the one end of the non-reflector is formed of a portion of the organic EL device. In FIG. 20B, a transparent electrode 61, which is made of a semi-transparent film, is located on the substrate. A transparent organic EL layer 62 having at least a light emitting layer is stacked on the transparent electrode 61. The organic EL layer 62 incorporates an optical reflective film 63 having the property of charge transportation and semi-transmittance. A reflective backside electrode 64 is stacked on the organic EL layer 62.

In above arrangement, the optical reflective film 63 and backside electrode 64 constitute a non-reflector which is adjusted to cancel the external light incident from the side of the substrate by its optical interference with the reflected light beams at the interfaces between the adjacent layers. In above arrangement, the reflected light at the interface between the substrate and the transparent electrode 61 and the reflected light at the interface between the transparent electrode 61 and organic EL device, which have a very small amount, are negligible. In such an organic EL device, r$_1$ and r$_2$ may be adjusted to set the external light intensity reflectance M$_{EXT}$ at 10% or less.

Since the non-reflector has a part of the organic EL device, the number of the semi-transparent optical members and optical reflective films to be formed can be reduced so that the organic EL device can be low-profiled. Since other members are not required, the manufacturing process can be simplified and the production efficiency can be improved.

In accordance with the organic EL display described hitherto, the light emission efficiency of the organic EL light can be enhanced without using a circularly-polarizing filter while improving the contrast of the organic EL display. Further, the light emission efficiency of the organic EL display can be enhanced in the state where the current flowing through the organic layer has been decreased.

Although the present invention has been shown and described with reference to specificpreferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. An organic electroluminescent display comprising:
an organic electroluminescent device having a light emitting layer made of an organic material and at least two electrodes sandwiching the light emitting layer;
a front reflecting portion arranged on a side of a viewer with respect to the light emitting layer; and
a rear reflecting portion arranged on a side opposite to the viewer with respect to the light emitting layer,
wherein the optical film thickness of the light emitting layer, intensity reflectance R$_1$ at the front reflecting portion and intensity reflectance R$_2$ at the rear reflecting portion are configured so that an intensity reflectance of the external light viewed from the viewer is set to be 10% or less by an optical interference effect.

2. The organic electroluminescent display as claimed in claim 1, wherein the intensity reflectance R$_1$ and the intensity reflectance R$_2$ are configured to be R$_1 \leq$R$_2$.

3. The organic electroluminescent display as claimed in claim 1, wherein the intensity reflectance $R_1$ and the intensity reflectance $R_2$ are configured to satisfy the following Equation (1)

$$\left(\frac{\sqrt{R_1}-\sqrt{R_2}}{1-\sqrt{R_1R_2}}\right)^2 \leq 0.1. \qquad \text{Equation (1)}$$

4. The organic electroluminescent display as claimed in claim 1, wherein the intensity reflectance $R_1$ and the intensity reflectance $R_2$ are configured to be approximately equal.

5. The organic electroluminescent display as claimed in claim 1, wherein the intensity reflectance $R_2$ is configured to be in a range of from 5% to 50%.

6. The organic electroluminescent display as claimed in claim 1, wherein the front reflecting portion comprises a substrate and at least one transparent or semi-transparent film.

7. The organic electroluminescent display as claimed in claim 6, wherein the film comprises either one of the two electrodes.

8. The organic electroluminescent display as claimed in claim 1, wherein the organic electroluminescent device further comprises a substrate, and wherein the front reflecting portion comprises an interface between either one of the electrodes and the substrate of the organic electroluminescent device.

9. The organic electroluminescent display as claimed in claim 1, wherein the organic electroluminescent device further comprises a transparent film, and wherein the front reflecting portion comprises an interface between either one of the electrodes and the transparent film of the organic electroluminescent device.

10. The organic electroluminescent display as claimed in claim 1, wherein the front reflecting portion comprises air and a transparent or semi-transparent film.

11. The organic electroluminescent display as claimed in claim 1, wherein the rear reflecting portion comprises either one of the electrodes.

12. The organic electroluminescent display as claimed in claim 1, wherein the rear reflecting portion comprises a plurality of reflective, transparent or semi-transparent films.

13. The organic electroluminescent display as claimed in claim 12, wherein at least one of the films comprises either one of the electrodes.

* * * * *